(12) United States Patent
Buskirk et al.

(10) Patent No.: US 11,186,084 B2
(45) Date of Patent: Nov. 30, 2021

(54) ELECTRODE STRUCTURES FOR MICRO-VALVES FOR USE IN JETTING ASSEMBLIES

(71) Applicant: Matthews International Corporation, Pittsburgh, PA (US)

(72) Inventors: William A. Buskirk, Albany, OR (US); Steven E. Flego, Portland, OR (US); Charles C. Haluzak, Philomath, OR (US); John Whitlock, Pittsburgh, PA (US); Eric R. Miller, Seattle, WA (US); Glenn J. T. Leighton, South Yorkshire (GB); Charles Gilson, Philomath, OR (US)

(73) Assignee: Matthews International Corporation, Pittsburgh, PA (US)

( * ) Notice: Subject to any disclaimer, the term of this patent is extended or adjusted under 35 U.S.C. 154(b) by 0 days.

(21) Appl. No.: 16/407,461

(22) Filed: May 9, 2019

(65) Prior Publication Data

US 2019/0346067 A1 Nov. 14, 2019

Related U.S. Application Data

(60) Provisional application No. 62/670,286, filed on May 11, 2018.

(51) Int. Cl.
*B41J 2/14* (2006.01)
*F16K 99/00* (2006.01)
(Continued)

(52) U.S. Cl.
CPC ....... *B41J 2/14282* (2013.01); *B41J 2/14201* (2013.01); *B41J 2002/14491* (2013.01);
(Continued)

(58) Field of Classification Search
CPC ................ B41J 2/14282; B41J 2/14201; B41J 2002/14491; B41J 2202/05; B41J 2202/18;
(Continued)

(56) References Cited

U.S. PATENT DOCUMENTS 4,072,959 A 2/1978 Elmqvist
4,340,083 A 7/1982 Cummins
(Continued)

FOREIGN PATENT DOCUMENTS

DE          10133939 A1    1/2003
DE    10 2004 035 844 B3   10/2005
(Continued)

OTHER PUBLICATIONS

International Search Report and Written Opinion for International Application No. PCT/IB2019/053838, dated Sep. 11, 2019, 16 pages.
(Continued)

*Primary Examiner* — Geoffrey S Mruk
(74) *Attorney, Agent, or Firm* — Troutman Pepper Hamilton Sanders LLP

(57) ABSTRACT

A micro-valve includes an orifice plate including an orifice. The micro-valve further includes an actuating beam having a first end and a second end. The actuating beam also includes a base layer and a layer of piezoelectric material disposed on the base layer, a bottom electrode layer, and a top electrode layer. At an electrical connection portion of the actuating beam, the layer of piezoelectric material includes a first via, and a portion of the top electrode layer disposed within the first via, and a portion of the bottom electrode disposed beneath the first via. The actuating beam includes a base portion extending from the electrical connection portion and a cantilevered portion extending from the base
(Continued)

portion. The cantilevered portion is movable in response to application of a differential electrical signal between the bottom electrode layer and the top electrode layer to one of open or close the micro-valve.

19 Claims, 10 Drawing Sheets

(51) Int. Cl.
  *H01L 41/047* (2006.01)
  *H01L 41/053* (2006.01)
  *H01L 41/09* (2006.01)

(52) U.S. Cl.
  CPC ........ *B41J 2202/05* (2013.01); *B41J 2202/18* (2013.01); *F16K 99/0048* (2013.01); *F16K 2099/0092* (2013.01); *H01L 41/0475* (2013.01); *H01L 41/0533* (2013.01); *H01L 41/094* (2013.01)

(58) Field of Classification Search
  CPC ......... F16K 99/0048; F16K 2099/0092; H01L 41/0475; H01L 41/0533; H01L 41/094
  See application file for complete search history.

(56) References Cited

U.S. PATENT DOCUMENTS

| | | | |
|---|---|---|---|
| 4,409,601 A | 10/1983 | Nilsson et al. | |
| 4,450,375 A | 5/1984 | Siegal | |
| 4,564,846 A | 1/1986 | Siegal | |
| 4,629,926 A | 12/1986 | Siegal | |
| 4,758,226 A | 7/1988 | Carre | |
| 4,809,017 A | 2/1989 | Fost | |
| 4,962,391 A | 10/1990 | Kitahara et al. | |
| 5,072,959 A | 12/1991 | Marullo | |
| 5,079,472 A | 1/1992 | Uhl et al. | |
| 5,126,755 A | 6/1992 | Sharpe et al. | |
| 5,452,878 A | 9/1995 | Gravesen et al. | |
| 5,619,177 A | 4/1997 | Johnson et al. | |
| 5,784,083 A | 7/1998 | Schumann et al. | |
| 5,857,491 A | 1/1999 | Cooke | |
| 5,901,939 A | 5/1999 | Cabuz et al. | |
| 6,024,340 A | 2/2000 | Lazarus et al. | |
| 6,116,517 A | 9/2000 | Heinzl et al. | |
| 6,142,444 A | 11/2000 | Kluge | |
| 6,164,621 A | 12/2000 | Bouchard et al. | |
| 6,352,337 B1 | 3/2002 | Sharma | |
| 6,367,767 B2 | 4/2002 | Weinmann et al. | |
| 6,412,913 B1 | 7/2002 | Moon et al. | |
| 6,450,204 B2 | 9/2002 | Itzhaky | |
| 6,460,979 B1 | 10/2002 | Heinzl et al. | |
| 6,464,341 B1 | 10/2002 | Furlani et al. | |
| 6,581,638 B2 | 6/2003 | Frisch et al. | |
| 6,676,249 B2 | 1/2004 | Lebens | |
| 6,811,136 B2 | 11/2004 | Eberhardt et al. | |
| 6,959,911 B2 | 11/2005 | Strasser et al. | |
| 6,988,706 B2 | 1/2006 | Seeley et al. | |
| 6,991,214 B2 | 1/2006 | Richter | |
| 7,159,841 B2 | 1/2007 | Gemmen et al. | |
| 7,299,818 B2 | 11/2007 | Pinter et al. | |
| 7,322,376 B2 | 1/2008 | Frisch | |
| 7,448,412 B2 | 11/2008 | Teach et al. | |
| 7,540,592 B2 | 6/2009 | Silverbrook | |
| 9,975,347 B2 | 5/2018 | Tozuka et al. | |
| 10,155,385 B2 | 12/2018 | Hiramoto et al. | |
| 2003/0030705 A1 | 2/2003 | Koike et al. | |
| 2003/0076649 A1 | 4/2003 | Speakman | |
| 2003/0234835 A1 | 12/2003 | Torii et al. | |
| 2004/0137300 A1 | 7/2004 | Gemmen et al. | |
| 2005/0133751 A1 | 6/2005 | Seeley et al. | |
| 2005/0002591 A1 | 11/2005 | Wong et al. | |
| 2006/0092237 A1 | 5/2006 | Kwon et al. | |
| 2006/0209137 A1 | 9/2006 | Kojima et al. | |
| 2006/0255064 A1 | 11/2006 | Donaldson | |
| 2010/0141709 A1 | 6/2010 | DeBrabander et al. | |
| 2010/0321448 A1 | 12/2010 | Buestgens et al. | |
| 2011/0073188 A1 | 3/2011 | Marcus et al. | |
| 2011/0073788 A1 | 3/2011 | Marcus et al. | |
| 2012/0268529 A1 | 10/2012 | Baumer et al. | |
| 2014/0333703 A1* | 11/2014 | Buskirk | F16K 99/0007 347/85 |
| 2016/0189494 A1 | 6/2016 | Levesque et al. | |
| 2017/0274658 A1 | 9/2017 | Terasaki | |
| 2018/0056288 A1 | 3/2018 | Abate et al. | |
| 2018/0147848 A1 | 5/2018 | Teranishi et al. | |
| 2018/0162140 A1 | 6/2018 | Buskirk et al. | |
| 2018/0361747 A1 | 12/2018 | Yaginuma et al. | |
| 2018/0370230 A1 | 12/2018 | Nakagawa et al. | |
| 2019/0086793 A1 | 3/2019 | Lyons et al. | |
| 2019/0344564 A1 | 11/2019 | Buskirk et al. | |
| 2019/0344568 A1 | 11/2019 | Buskirk et al. | |
| 2019/0346051 A1 | 11/2019 | Buskirk et al. | |
| 2019/0346066 A1 | 11/2019 | Buskirk et al. | |

FOREIGN PATENT DOCUMENTS

| | | |
|---|---|---|
| DE | 10 2007 034 049 B3 | 6/2008 |
| EP | 0 170 990 A1 | 2/1986 |
| EP | 1 104 863 A2 | 6/2001 |
| EP | 2 017 511 A1 | 1/2009 |
| EP | 3187337 A1 | 7/2017 |
| GN | 201022022 Y | 2/2008 |
| JP | 57-178767 A | 11/1982 |
| JP | 57-197176 A | 12/1982 |
| JP | S63-185471 A | 8/1988 |
| JP | S64-18643 A | 1/1989 |
| JP | 02033979 | 2/1990 |
| JP | 02273242 | 11/1990 |
| JP | 09-011471 A | 1/1997 |
| JP | 2819141 A | 10/1998 |
| JP | H11-105274 | 4/1999 |
| JP | 2000-296619 A | 10/2000 |
| JP | 2004-308554 A | 11/2004 |
| JP | 2009243911 A | 10/2009 |
| JP | 05116284 | 1/2013 |
| JP | 2013-533817 A | 8/2013 |
| WO | WO-86/05722 | 10/1986 |
| WO | 2000038928 A1 | 7/2000 |
| WO | WO-02/37661 A1 | 5/2002 |
| WO | WO-2009/010117 A1 | 1/2009 |
| WO | WO-2010/144343 A3 | 12/2010 |
| WO | WO-2012/002942 A1 | 1/2012 |
| WO | 2019215671 A1 | 11/2014 |
| WO | WO-2014/182984 A1 | 11/2014 |
| WO | WO-2016/030566 | 3/2016 |
| WO | 2019215668 A1 | 11/2019 |
| WO | 2019215669 A1 | 11/2019 |
| WO | 2019215672 A1 | 11/2019 |
| WO | 2019215674 A1 | 11/2019 |

OTHER PUBLICATIONS

International Search Report and Written Opinion for PCT/US2014/037422 dated Sep. 3, 2014.
Supplementary European Search Report and Written Opinion for EP14795127 dated Jun. 8, 2018.
Xiaoting et al. "Vibration Energy Harvesting Using Piezoelectric Unimorph Cantilevers With Unequal Piezoelectric and Nonpiezoelectric Lengths" Dec. 2010, Applied Physics Letters 97:233503 (PubMed, DOI: 10.1063/1.3521389, retrieved from the internet Aug. 30, 2020).

* cited by examiner

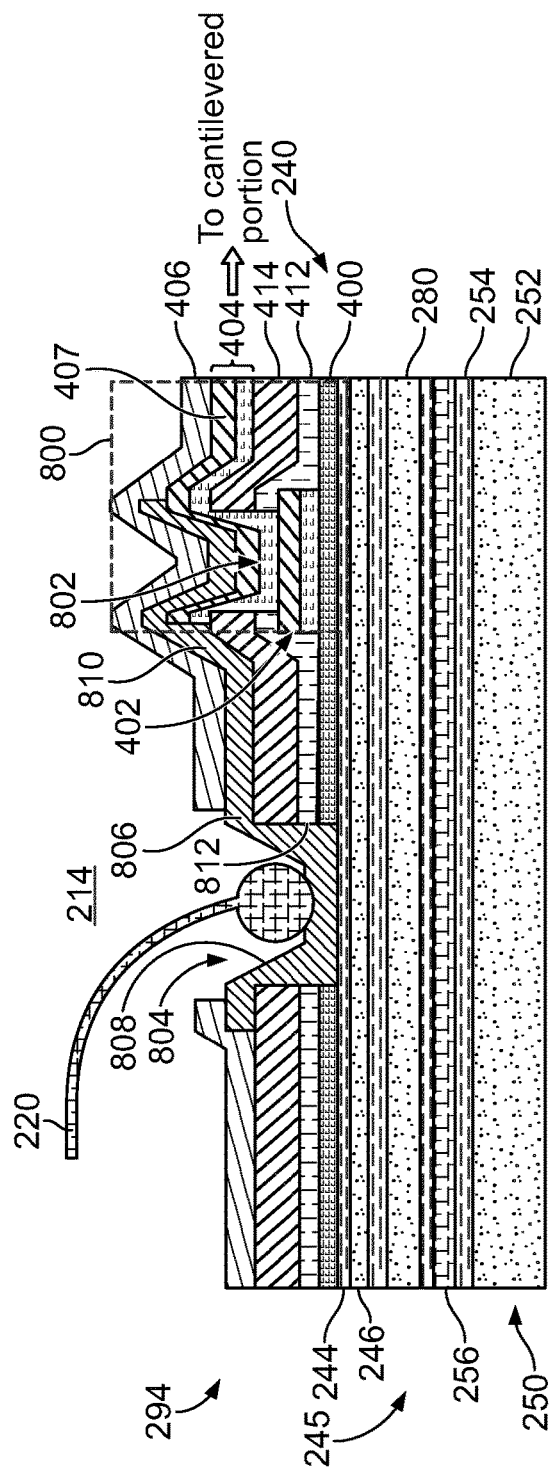
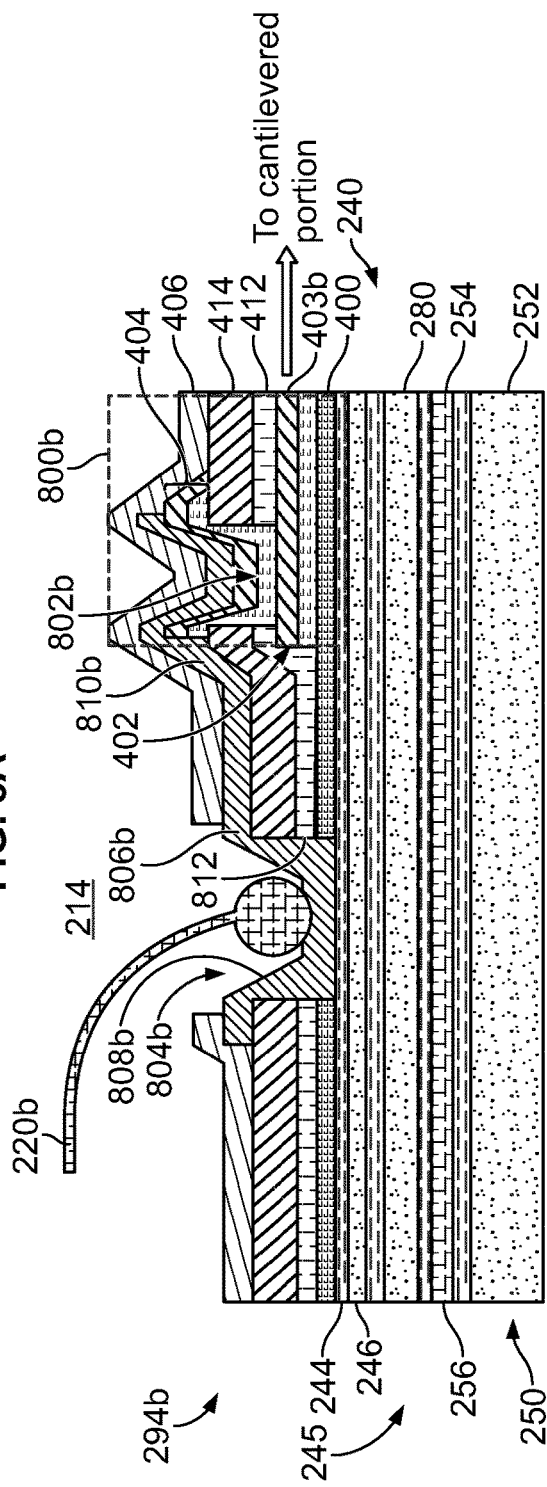
FIG. 8A
FIG. 8B

ELECTRODE STRUCTURES FOR MICRO-VALVES FOR USE IN JETTING ASSEMBLIES

CROSS-REFERENCE TO RELATED APPLICATIONS

The present application claims priority to and benefit of U.S. Provisional Application No. 62/670,286 filed May 11, 2018, the disclosure of which is hereby incorporated by reference herein in its entirety.

TECHNICAL FIELD

The present disclosure relates generally to the field of micro-valves fabricated using micro-electro-mechanical systems (MEMS) techniques. More specifically, the present disclosure relates to a jetting assembly including micro-valves that are used for industrial marking and coding.

BACKGROUND

Conventional printing technologies have several shortcomings. For example, continuous inkjet printers have certain deficiencies that are difficult to eliminate. The process of generating droplets from an ink supply, for example, may lead to ink dripping in an undesired direction (e.g., away from a target), leading to maintenance requirements. Additionally, makeup fluid is lost over time as a result of evaporation, requiring continuous replenishment. Other maintenance costs, such as repairing orifice plates due to degradation, are also required.

SUMMARY

One embodiment is directed to a micro-valve. The micro-valve includes an orifice plate including an orifice. The micro-valve further includes an actuating beam having a first end and a second end. The actuating beam also includes a base layer. A layer of piezoelectric material is disposed on the base layer and extends at least a portion of a distance between the first end and the second end. The layer of piezoelectric material defines a via therethrough at an electrical connection portion thereof. A bottom electrode layer is disposed on a first side of the layer piezoelectric material at the electrical connection portion thereof, a portion of the bottom electrode layer disposed beneath the via. A top electrode layer is disposed on a second side of the layer of piezoelectric material at the electrical connection portion thereof, a portion of the top electrode layer disposed through the via. The actuating beam includes a base portion extending from the electrical connection portion toward the first end and a cantilevered portion extending from the base portion to the second end. The cantilevered portion is movable in response to application of a differential electrical signal between the bottom electrode layer and the top electrode layer to one of open or close the micro-valve.

Another embodiment is directed to a micro-valve. The micro-valve includes an orifice plate including an orifice. The micro-valve further includes an actuating beam having a first end and a second end. The actuating beam also includes a base layer. A layer of piezoelectric material is disposed on the base layer and extends at least a portion of a distance between the first end and the second end. The layer of piezoelectric material defines a via therethrough to the base layer at an electrical connection portion thereof. A bottom electrode layer is disposed on a first side of the layer piezoelectric material at the electrical connection portion thereof, and a top electrode layer is disposed on a second side of the layer of piezoelectric material at the electrical connection portion thereof. The micro-valve also comprises a bonding pad. At least a portion of the bonding pad is disposed through the via on the base layers. The bonding pad comprises a bonding pad lead electrically connected to at least one of the bottom electrode layer or the top electrode layer. The actuating beam includes a base portion extending from the electrical connection portion toward the first end and a cantilevered portion extending from the base portion to the second end. The cantilevered portion is movable in response to application of a differential electrical signal between the bottom electrode layer and the top electrode layer to one of open or close the micro-valve.

Still another embodiment is directed to a jetting assembly. The jetting assembly includes a valve body having an orifice plate including a plurality of orifices extending therethrough. The jetting assembly further comprises a plurality of micro-valves. Each of the plurality of micro-valves comprise an actuating beam having a first end and a second end. The actuating beam also includes a base layer. A layer of piezoelectric material is disposed on the base layer and extends at least a portion of a distance between the first end and the second end. The layer of piezoelectric material defines a via therethrough at an electrical connection portion thereof. A bottom electrode layer is disposed on a first side of the layer piezoelectric material at the electrical connection portion thereof, a portion of the bottom electrode layer disposed beneath the via. A top electrode layer is disposed on a second side of the layer of piezoelectric material at the electrical connection portion thereof, a portion of the top electrode layer disposed through the via. The actuating beam includes a base portion extending from the electrical connection portion toward the first end and a cantilevered portion extending from the base portion to the second end. The cantilevered portion is movable in response to application of a differential electrical signal between the bottom electrode layer and the top electrode layer to one of open or close the micro-valve. The jetting assembly further includes a fluid manifold coupled to each of the plurality of micro-valves to define a fluid reservoir for each of the plurality of micro-valves.

BRIEF DESCRIPTION OF THE DRAWINGS

The disclosure will become more fully understood from the following detailed description, taken in conjunction with the accompanying figures, in which:

FIG. 8A is a cross-sectional view of a first electrical connection portion of an actuating beam of a micro-valve, and FIG. 8B is a cross-sectional view of a second electrical connection portion of the actuating beam of the micro-valve, according to an example embodiment.

DETAILED DESCRIPTION

Figure 1:
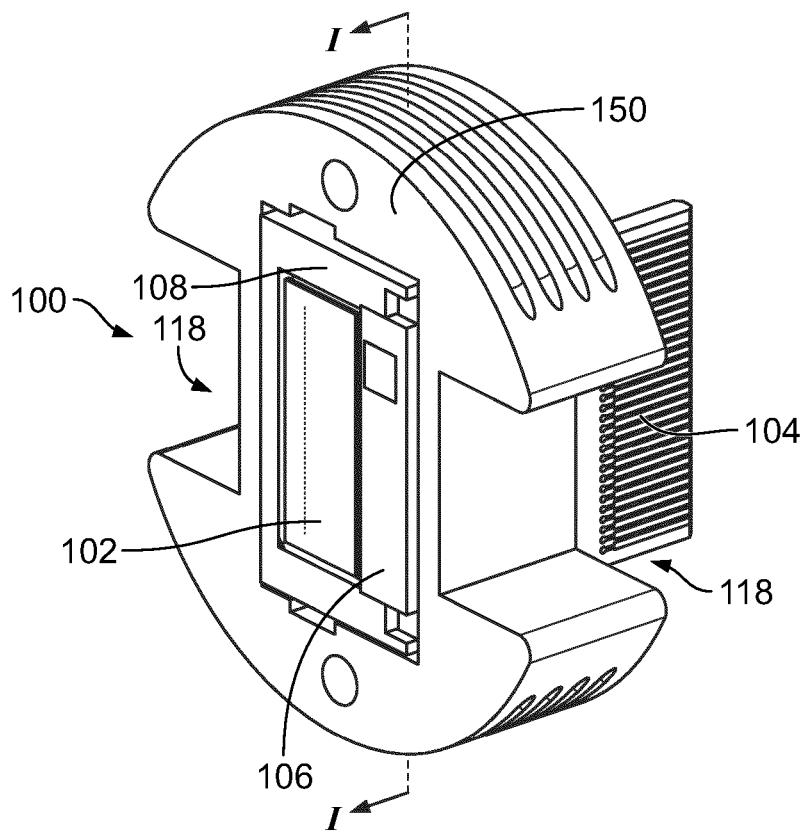
FIG. 1 is a perspective of a jetting assembly disposed in a holder, according to an example embodiment.

Before turning to the figures, which illustrate the exemplary embodiments in detail, it should be understood that the present application is not limited to the details or methodology set forth in the description or illustrated in the figures. It should also be understood that the terminology is for the purpose of description only and should not be regarded as limiting.

Referring generally to the figures, described herein is a jetting assembly including multiple micro-valves. The micro-valves described herein employ an actuating beam including a layer of piezoelectric material. The actuating beam is electrically connected to a circuit board at an electrical connection portion thereof. At the electrical connection portion, a wire bond pad (or bonding pad) is disposed on the actuating beam. The wire bond pad is conductively connected to at least one electrode disposed proximate to the layer of piezo-electrical material so as to provide a pathway for an electrical signal (e.g., a charge, a voltage, a current, etc.) to be provided to the layer of piezoelectric material. The actuating beam may further include a base portion extending from the electrical connection portion and a cantilevered portion extending from the base portion. The cantilevered portion may extend into a volume such that the cantilevered portion has room to move in response to receiving the electrical signal via the electrical connection portion. In response to the electrical signal being provided via the pathway, the cantilevered portion may move from a closed position, in which a sealing member disposed thereon contacts a valve seat to close a fluid plenum, to an open position, in which fluid may emerge from a fluid plenum to dispense ink onto a target.

As described herein, various aspects of the actuating beam have been designed to maximize performance and durability of the micro-valves. For example, in various embodiments, the actuating beam comprises a bottom electrode layer (also referred to herein as "the first electrode layer") disposed on a first (e.g., a bottom or lower) side of the layer of piezoelectric material and a top electrode layer (also referred to herein as "the second electrode layer") disposed on a second (e.g., top or upper) side of the layer of piezoelectric material. At the electrical connection portion, there may be a first via in the layer of piezoelectric material. A portion of the bottom electrode layer may be disposed beneath the first via on a first side of the layer of piezoelectric material, and a portion of the top electrode layer may be disposed through the first via and, for example, located above the portion of the bottom electrode layer. Beneficially, such a via increases a rate of signal transfer between the electrodes formed by the electrode layers and increases the rapidity of the actuating beam's response to the electrical signal. Additionally, in some embodiments, a second via may be defined through the layer of piezoelectric material to a base layer on which the piezoelectric layer is disposed at the electrical connection portion. At least a portion of the bonding pad may be disposed through the second via on the base layer and configured to receive wire bond. As described herein, such a structure eliminates the need to cure the layer of piezoelectric layer (e.g., during its deposition) when in contact with any of the electrodes. This ensures the maintenance of a desired tensile state of the electrodes such that the cantilevered portion has a desired default position in the absence of the electrical signal. Furthermore, the bonding pad is disposed on the base layer which is significantly more rigid and robust surface than the piezoelectric layer and provides a sufficiently strong surface for the bonding pad for receiving the wire bond.

In another aspect, the electrodes of the actuating beam are structured to facilitate passivation of the electrodes and the layer of piezoelectric material. As described herein, the plurality of micro-valves may be attached to a fluid manifold or input fluid manifold to define a reservoir for holding a fluid (e.g., an ink) to be deposited onto a target surface. The input fluid manifold may be formed from glass, silica, silicon, ceramics, plastics, etc., and include a structure having openings therein defined between arms of the structure that are attached to the actuating beam. In some embodiments, one of such arms is attached to the base portion of the actuating beam such that the cantilevered portion extends into one of the openings defining the reservoir. As such, the cantilevered portion extends into a volume in which the fluid is disposed. To isolate the electrodes of the actuating beam from the fluid, a passivation structure may be disposed on the layer of piezoelectric material. In various embodiments, a delimiting boundary (e.g., an outer circumferential edge) of the bottom electrode is disposed inward of a delimiting boundary of the actuating beam. The passivation structure may be disposed on the second electrode such that it completely covers the second electrode. For example, the passivation structure may completely cover the second electrode such that, at the delimiting boundary of the actuating beam, the passivation structure directly contacts the layer of piezoelectric material. Beneficially, such a structure isolates the entirety of the electrode from the fluid, which prevents any corrosion from taking place and ensures a high durability of the micro-valve structure. Furthermore, the layer of piezoelectric material may extend beyond and overlap lateral edges of the bottom electrode layer so as to encapsulate at least a portion of the bottom electrode layer proximate to the top electrode layer. This prevents any leakage current from traveling between the bottom and top electrode layers, therefore preventing short circuits and performance deterioration.

As described herein, the term "default position," when used in describing an actuating beam of a micro-valve, describes the position of the actuating beam with respect to various other components of the micro-valve without application of any control signals (e.g., an electrical charge, current or voltage) to the actuating beam. In other words, the default position is the position of the actuating beam (and any components attached thereto) when the actuating beam is in a passive state. It should be appreciated that other embodiments are envisioned in which the default position is an open position of the actuating beam.

Referring now to FIG. 1, a perspective view of a jetting assembly 100 disposed in a holder 150 is shown, according to an example embodiment. Jetting assembly 100 includes a valve body 102 attached to a carrier 108. The holder 150 includes a substantially circular-shaped body having an opening contained therein adapted to receive the jetting assembly 100. Holder 150's body may include notches 118 extending from a peripheral edge thereof to facilitate attachment of the holder 150 to a marking device. The valve body 102 may be component of a marking device. In an exemplary embodiment, the valve body 102 is used in an industrial marking device including a pressurized ink supply. In other embodiments, the valve body 102 or any of the micro-valves described herein may be used in pneumatic applications, where the fluid includes a gas (e.g., air, nitrogen, oxygen, etc.).

As described herein, the valve body 102 includes an input fluid manifold attached to a plurality of micro-valves. The micro-valves and the input fluid manifold form a fluid reservoir configured to hold fluid received from an external fluid supply. In other embodiments, the valve body 102 may define a plurality of fluid reservoirs, each fluid reservoir corresponding to at least a portion of the plurality of micro-valves. In such embodiments, each fluid reservoir may be filled with a different colored ink (e.g., black, green, yellow, cyan, etc.) or a different fluid so as to provide multi-color capable jetting assembly or a multi fluid deposition assembly. In various embodiments, the micro-valves include an actuating beam configured to move (e.g., bend, curve, twist, etc.) in response to voltages being applied thereto to temporarily open fluid outlets at orifices in an orifice plate. As a result, droplets are emitted from the fluid outlets onto a target to produce a desired marking pattern on the target.

As shown, a circuit board 104 is attached to a side surface of the carrier 108. Circuit board 104 may include a plurality of electrical pathways and provide a point of connection between valve body 102 and an electrical controller (e.g., via a wiring harness). The electrical controller may supply control signals via the electrical pathways to control actuation of the actuating beams of multiple micro-valves included in the valve body 102. The structure and function of such micro-valves are described in greater detail herein. In some embodiments, circuit board 104 itself includes a micro-controller that generates and provides control signals to actuate the micro-valves.

An identification tag 106 is attached to jetting assembly 100. In some embodiments, identification tag 106 includes an internal memory configured to store various forms of information (e.g., manufacturing information, serial number, valve calibration information, settings, etc.) regarding jetting assembly 100. For example, in one embodiment, identification tag 106 is a radio frequency identification (RFID) tag configured to transmit the stored information in a receivable manner in response to receiving a predetermined identifier from an external device. This way, information regarding jetting assembly 100 may be quickly and efficiently retrieved.

Figure 2:
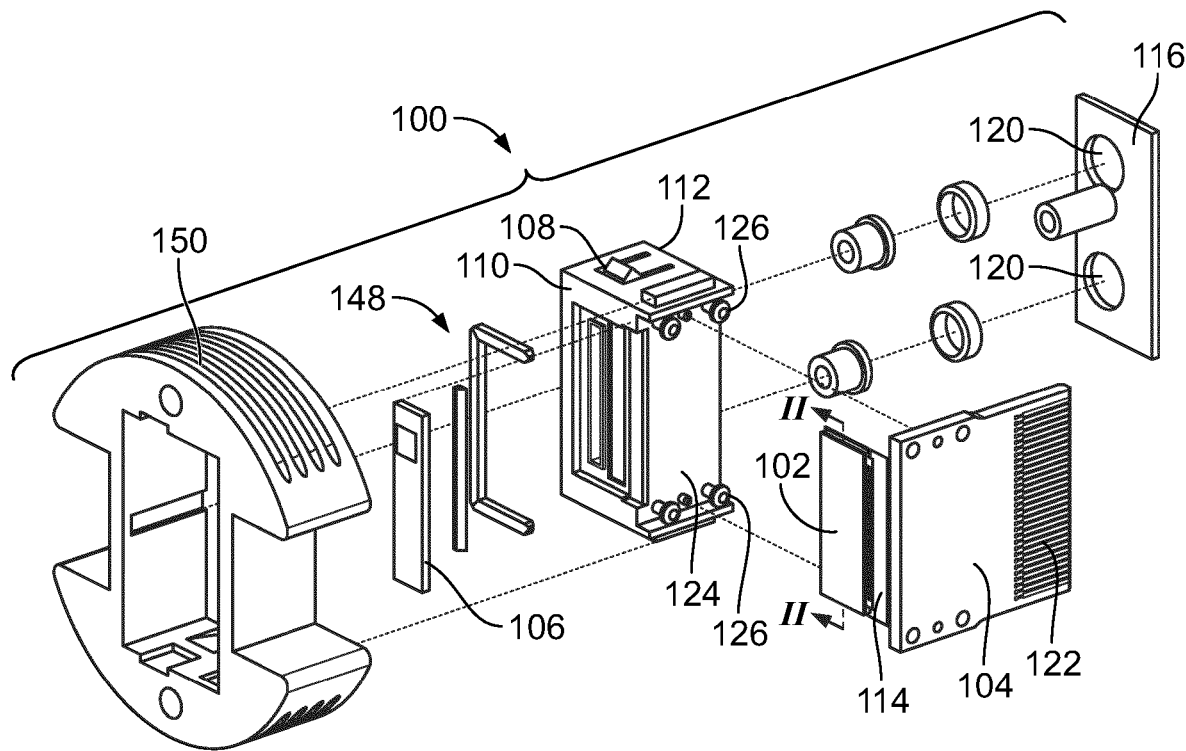
FIG. 2 is an exploded view of the jetting assembly shown in FIG. 1.

Referring now to FIG. 2, an exploded view of jetting assembly 100 is shown, according to an example embodiment. Carrier 108 includes a front-side surface 110, a rear-side surface 112, and a side surface 124. In various embodiments, valve body 102 is attached to front-side surface 110 via an adhesive. The rear-side surface 112 has a cover 116 disposed thereon. Cover 116 includes apertures 120 providing supply ports for fluid (e.g., ink) for deposition onto a target via the valve body 102. For example, in some embodiments, fluid (e.g., ink) is supplied to the valve body 102 via a first one of the apertures 120 (e.g., via an input supply line or hose), circulated through valve body 102, and output from the valve body 102 via a second one of the apertures 120. In other words, the fluid is recirculated through the fluid plenum. A septum may be positioned in each of the apertures 120 and configured to allow insertion of a fluid delivery or fluid return needle therethrough so as to allow communication of the fluid into the fluid plenum while maintaining fluidic sealing of the jetting assembly 100. In particular embodiments, the septum may include a single septum sheet which extends below each of the first one and the second one of the apertures. While not shown, in some embodiments, a heating element (e.g., a resistive wire) may be positioned proximate to the valve body 102 or the carrier 108 (e.g., around or coupled to side wall thereof). The heating element may be used to selectively heat the fluid (e.g., ink) contained within the fluid plenum so as to maintain the fluid at a desired temperature. Furthermore, a temperature sensor (not shown), e.g., a thermal sense resistor, may also be provided in the carrier 108, for example, to determine a temperature of the fluid flowing through the jetting assembly 100.

The front-side surface 110 includes a cavity adapted to receive valve body 102 such that valve body 102 is mounted securely to the front-side surface 110 (e.g., via an adhesive). Circuit board 104 is attached to carrier 108 via the side surface 124. As shown, the side surface 124 includes mounting pegs 126. In various embodiments, circuit board 104 includes apertures arranged in a manner corresponding to the arrangement of the mounting pegs 126 and are adapted to receive the mounting pegs 126 to align the circuit board 104 to the carrier 108.

As shown, circuit board 104 has a flex circuit 114 attached thereto. Flex circuit 114 extends at an angle from circuit board 104 and is attached to the carrier 108 proximate to the front-side surface 110. The valve body 102 and circuit board 104 are arranged perpendicularly to one another, as the flex circuit 114 extends around a corner boundary of front-side surface 110. Circuit board 104 also includes a controller interface 122 including electrical connection members (e.g., pins) configured to receive control signals from a marking system controller.

As described herein, in various embodiments, the flex circuit 114 may be disposed between a fluid manifold and the carrier 108, or an interposer disposed between the carrier 108 and the valve body 102 to facilitate formation of electrical connections between flex circuit 114 and electrodes of the plurality of micro-valves included in valve body 102. In some embodiments, flex circuit 114 is attached to front-side surface 110 via a mounting member 148. An opening in flex circuit 114 is aligned with a septum in carrier 108 to provide a fluid inlet to a fluid plenum formed via the valve body 102.

Figure 3:
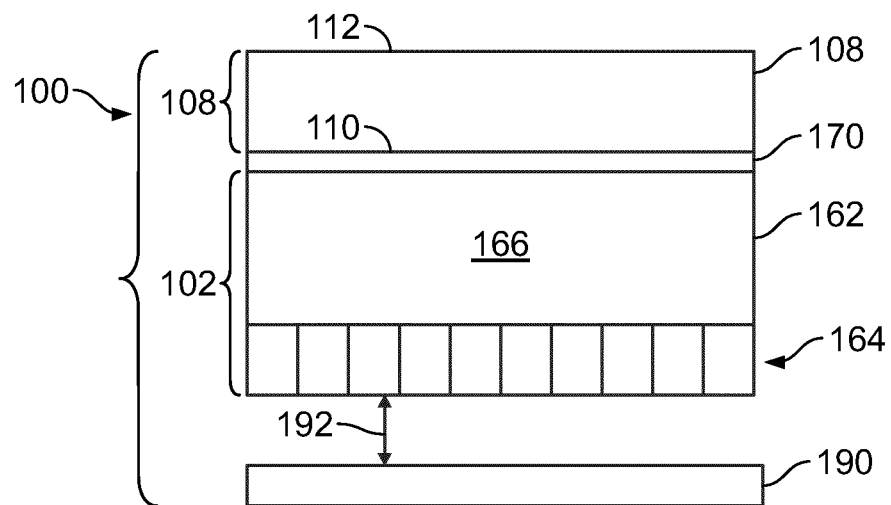
FIG. 3 is a schematic cross-sectional view of the jetting assembly shown in FIG. 1.

Referring now to FIG. 3, a schematic depiction of various components of jetting assembly 100 is shown, according to an example embodiment. For example, FIG. 3 may depict a cross sectional view of jetting assembly 100 at the line I-I shown in FIG. 1. As shown, the valve body 102 extends from front-side surface 110 of the carrier 108 via an interposer 170. The interposer 170 provides structural support to ensure maximal performance of various components in valve body 102. While not shown, in some embodiments, a compliant layer (e.g., a silicone or rubber layer) may also be disposed above or below the interposer 170 or any other location in the stack so as to provide stress relief.

The valve body 102 includes an input fluid manifold 162 and a plurality of micro-valves 164 attached to the input fluid manifold 162. The micro-valves 164 and input fluid manifold 162 form a fluid reservoir 166 for fluid (e.g., a combination of ink and makeup fluid) received from a pressurized fluid supply (e.g., via apertures 120 in a cover 116 attached to the rear-side surface 112). In various embodiments, the fluid supply includes a fluid reservoir and a pump configured to provide pressurized fluid to jetting assembly 100 via a supply line coupled to carrier 108. In various embodiments, the fluid supply supplies fluid pressurized between 7 and 15 PSI when one or more of the micro-valves 164 are open. For example, in one embodiment, the fluid has a pressure of approximately 10 PSI. Carrier 108 may include an internal cavity configured to receive the pressurized fluid and deliver the fluid to the fluid reservoir 166. In various embodiments, a pressure differential may be maintained between the fluid reservoir 166 and the fluid supply so as to drive the fluid out of the valve body 102.

Input fluid manifold 162 may include a glass structure including a channel forming the fluid reservoir 166. Generally, the micro-valves 164 include actuating beams held in spaced relation to orifices on an orifice plate at the front-side surface 110. The actuating beams may include at least one layer of piezoelectric material configured to deflect in response to receiving control signals (e.g., electrical voltage waveforms provided via controller interface 122 on the circuit board 104). As described herein, application of such electrical signals causes the micro-valves 164 to open, which causes droplets to be released at the orifice plate. The droplets advance a throw distance 192 onto a substrate 190 to produce a desired pattern on the substrate 190. In some embodiments, a weight of a single fluid droplet dispensed by a micro-valve 164 or any other micro-valve described herein may be in a range of 200 nanograms to 300 nanograms. In some embodiments, a volume of a single droplet dispensed may be in a range of 200 picoliter to 300 picoliter. The structure and function of various components of micro-valves 164 is described in greater detail herein. In other embodiments, the actuating beam may include a stainless steel actuating beam (e.g., having a length of approximately 1 mm). In still other embodiments, the actuating beam may include a bi-morph beam having two layers of a piezoelectric material disposed on either side of a base layer (e.g., a base silicon stainless steel layer). An electrical signal (e.g., an electrical voltage) may be applied to either one of the piezoelectric layers so as to urge the actuating beam to bend toward the corresponding piezoelectric layer. The two piezoelectric layers may include the same piezoelectric material or different piezoelectric materials. In particular embodiments, a different electrical signal may be applied to each of the piezoelectric layer so as to bend or curve the actuating beam a predetermined distance towards or away from the orifice.

While embodiments described herein generally describe the actuating beam as including a piezoelectric material, in other embodiments, any other actuation mechanism may be used. For example, in some embodiments, the actuating beams may include a capacitive coupling for moving the actuating beams. In other embodiments, the actuating beams may include an electrostatic coupling. In still other embodiments, the actuating beams may include a magnetic coupling (e.g., an electromagnetic structure activated by an electromagnet) for moving the beam. In yet other embodiments, the actuating beams may comprise a temperature sensitive bimetallic strip configured to move in response to temperature change.

Interposer 170 generally adds rigidity to various portions of the valve body 102. For example, the interposer 170 may be constructed to be more rigid than components (e.g., the orifice plate, the actuating beam, etc.) of valve body 102 to counteract stressed induced by attaching such components to one another. For example, the interposer 170 may be attached to valve body 102 to counteract stresses induced by an adhesive used to attach the carrier 108 to the valve body 102. Additionally, the interposer 170 may counteract stresses at interfaces between the input fluid manifold 162 and micro-valves 164.

Figure 4A:
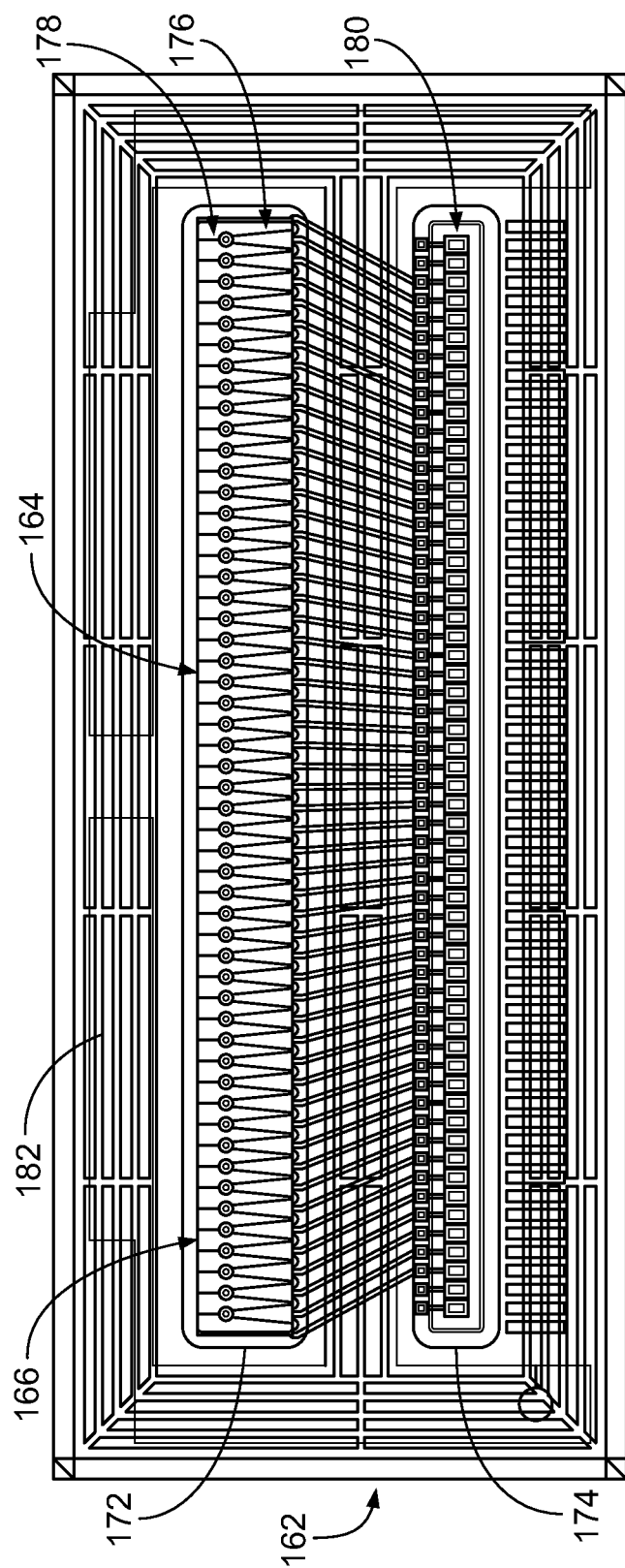
FIG. 4A is a plan view of the jetting assembly shown in FIG. 1.

Referring now to FIG. 4A, a plan view of the jetting assembly 100 is shown, according to an example embodiment. FIG. 4A shows a plan view of valve body 102 at the line II shown in FIG. 2. As such, FIG. 4A shows a cross-sectional view at an interface between input fluid manifold 162 and orifice plate. Input fluid manifold 162 includes a first opening 172 and a second opening 174. The first opening 172 exposes the plurality of micro-valves 164 to form the fluid reservoir 166 configured to hold fluid received from a fluid supply.

In the example shown, the plurality of micro-valves 164 include a plurality of actuating beams 176 aligned in a single row. Each of the plurality of actuating beams 176 has a sealing member 178 disposed at an end thereof. In some embodiments, the sealing members 178 are aligned with and contact valve seats disposed at orifices in the orifice plate to prevent fluid contained in the fluid reservoir 166 from escaping the fluid reservoir 166 in the absence of any electrical signals. The jetting assembly 100 is shown to include 52 actuating beams 176 forming 52 micro-valves 164.

In various embodiments, each of the plurality of actuating beams 176 extends from a member disposed underneath a boundary between the first and second openings 172 and 174. Each of said members may include an electrical connection portion exposed via the second opening 174. Bonding pads 180 (also referred to herein as "electrical contact pads 180") are disposed at each of the electrical connection portions. Wire bonds electrically connect each of the electrical connection portions to the controller interface 122 via the electrical contact pads 180. As such, electrical signals may be received by each of the actuating beams 176 via the electrical contact pads 180. In other embodiments, tape automated bonding (TAB) may be used to electrically connect each of the electrical connection portions to the controller interface 122 via the electrical contact pads 180.

The boundary between the first and second openings 172 and 174 isolates the electrical contact pads 180 from the fluid contained in a reservoir formed by the fluid opening 172. Also beneficially, the electrical contact pads 180 are disposed beneath input fluid manifold 162. This means that electrical connections between actuating beams 176 are disposed on the interior of carrier 108 and are protected from deterioration and external contamination.

To isolate electrical contact pads 180 from the fluid contained in the fluid reservoir 166, an adhesive structure 182 is disposed on input fluid manifold 162. Adhesive structure 182 couples the input fluid manifold 162 to the orifice plate. As shown in FIG. 4A, adhesive structure 182 forms "racetracks" around each of the first and second openings 172 and 174. The racetracks provide barriers for fluid that seeps between the input fluid manifold 162 and the orifice plate as well as prevent particles from entering the input fluid manifold. The racetrack adhesive structure 182 may be present on one or both of the input fluid manifold 162 side or the orifice plate side. For example, the racetracks may be constructed of several concentric rectangular loops of an adhesive material (e.g., a negative photo resist such as a bisphenol-A novalac glycidyl ether based photoresist sold under the tradename SU-8 or polymethylmethacrylate, polydimethylsiloxane, silicone rubber, etc.) around each of the first and second openings 172 and 174. Segments of adhesive material may be cut across multiple ones of the rectangular loops to form compartments for receiving seeping fluid. Such an adhesive structure 182 facilitates fluidic isolation between micro-valves 164 and electrical contact pads 180. In other embodiments, the adhesive structure 182 may be formed from silicon and used to bond the input fluid manifold 162 to the orifice plate via fusion bonding, laser bonding, adhesives, stiction, etc. The adhesive structure 182 may be disposed on the input fluid manifold 162 and the valve body 102 coupled thereto, disposed on the valve body 102 and the input fluid manifold 162 coupled thereto, or disposed on each of the input fluid manifold 162 and the valve body 102 before coupling the two.

Figure 4B:
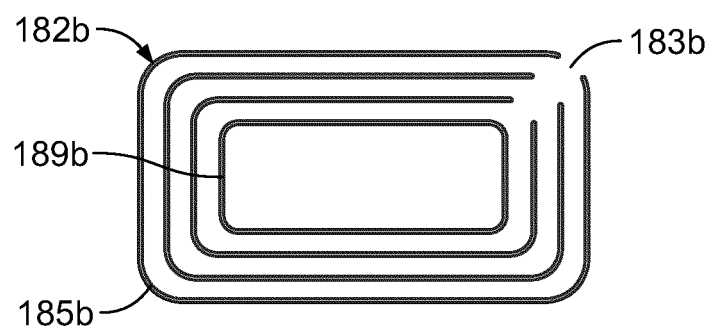
FIG. 4B is a schematic illustration of an adhesive structure that may be used in the jetting assembly of FIG. 1, according to an example embodiment.

In some embodiments, the adhesive structure 182 may be vented. For example, FIG. 4B shows a schematic illustration of an adhesive structure 182*b*. The adhesive structure 182*b* may be formed from SU-8, silicon or any other suitable material and includes a plurality of loops 189*b* such that the adhesive structure has a race track shape. An inner most loop of the plurality of loops 189*b* of the adhesive structure 182*b* that surrounds the input fluid manifold 162 forms a closed loop. In contrast, the remaining of the plurality of loops 189*b* positioned radially outwards of the inner most loop include vents 183*b*, for example, slots or openings defined therein. The vents 183*b* may facilitate bonding of input fluid manifold 162 to the orifice plate by allowing air that may get trapped in between the plurality of loops 189*b* of the adhesive structure 182*b* to escape via the vents 183*b*. While FIG. 4B shows the vents 183*b* being radially aligned with each other and located at corners of each loop, in other embodiments, one or more vents 183*b* of one loop may be radially offset from a vent defined in an adjacent loop.

As shown in FIG. 4B, corners of the each loop of the adhesive structure 182*b* may be rounded. Furthermore, corners of the input fluid manifold 162, the interposer 170, the flex circuit 114 or any other layers or components included in the jetting assembly 100 may be rounded, for example, to reduce stress concentration that can occur at sharp corners.

Figure 5A:
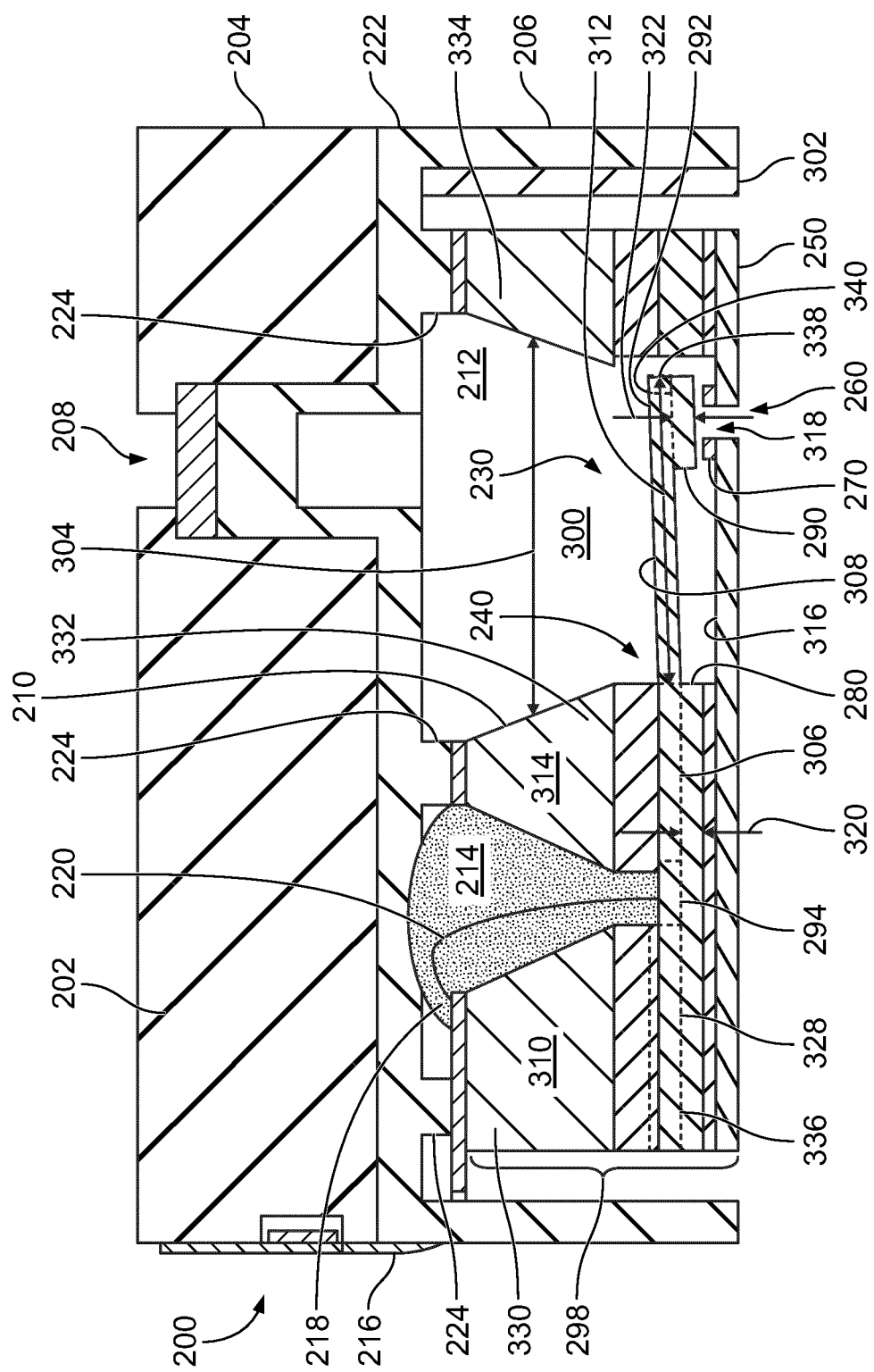
FIG. 5A is a-cross sectional view of a jetting assembly including a micro-valve, according to an example embodiment.

Referring now to FIG. 5A, a cross sectional view of a jetting assembly 200 including a micro-valve 230 is shown, according to an example embodiment. In some embodiments, jetting assembly 200 is an example embodiment of the jetting assembly 100 described with respect to FIGS. 1, 2, 3, and 4A-B. As shown, jetting assembly 200 includes a carrier 202 attached to a valve body 298 via a structural layer 222. In some embodiments, the carrier 202 may include the structural layer 222.

Carrier 202 includes an upper portion 204 and a housing portion 206 extending from an edge of upper portion 204. Upper portion 204 includes a septum 208 by which pressurized ink is provided. Housing portion 206 defines a cavity into which the valve body 298 is disposed. Valve body 298 includes an input fluid manifold 210 and the micro-valve 230. As shown, input fluid manifold 210 and micro-valve 230 define a reservoir 300 configured to hold a volume of pressured fluid received from an external fluid supply via septum 208. In various embodiments, the pressurized fluid held within the reservoir 300 is a combination of an ink and additional fluids in a liquid state.

Carrier 202 may be formed of plastic, ceramic, or any other suitable material. Carrier 202 facilitates operation of the jetting assembly 200 by providing structural support to valve body 298. For example, in some embodiments, peripheral edges of valve body 298 are attached to housing portion 206 via layers of adhesive 302 disposed at the inner surface of housing portion 206. Such adhesive facilitates maintenance of a desired relative positioning between micro-valve 230 and input fluid manifold 210.

In various embodiments, input fluid manifold 210 is pre-formed prior to its attachment to the additional components of the jetting assembly 200. Input fluid manifold 210 is formed by a body 310 (e.g., formed from glass, silicon, silica, etc.) having any suitable thickness (e.g., 500 microns). As shown, input fluid manifold 210 is pre-formed to include a first arm 330, a second arm 332, and a third arm 334. As used herein, the term "arm," when used to describe the input fluid manifold 210, is used to describe a structure separating openings contained in the input fluid manifold 210. As such, the arms 330, 332, and 334 may have any suitable shape. For example, in some embodiments, the arms 330, 332, and 334 are substantially rectangular-shaped, having substantially planar side surfaces. In other embodiments, the side surfaces may be angled such that the arms 330, 332, and 334 are substantially trapezoidal-shaped. The arms 330, 332, and 334 may be formed by creating openings in a structure (e.g., a silicon or glass structure) using any suitable method (e.g., wet etching or dry etching such as deep reactive ion etching).

As shown, a first channel 212 separates the arms 330 and 332 from one another and a second channel 214 separates the arms 332 and 334 from one another. The first and second channels 212 and 214 are substantially linear and parallel to one another in the shown embodiment, but input fluid manifold 210 may be arranged as needed for the arrangement of micro-valves to be disposed thereon. First channel 212 is formed to have a width 304 bearing a predetermined relationship to a length 312 of a cantilevered portion 308 of an actuating beam 240 of the micro-valve 230, for example, in a range of about 500-1,000 microns. For example, first channel 212 may be formed to have a width 304 greater than a desired length 312 of cantilevered portion 308 by a threshold amount. Second channel 214 provides an avenue for an electrical connection to be formed between the actuating beam 240 and a flex circuit 216 via wire bonds 220 extending in between. Beneficially, using such an arrangement internalizes electrical connections between actuating beam 240 and flex circuit 216. In other words, electrical connections between such components are not external to carrier 202, and are thus less vulnerable to degradation. In various embodiments, the first channel 212 and/or the second channel 214 may have inclined sidewalls.

As shown, second channel 214 is substantially filled with an encapsulant 218. Encapsulant 218 may include an epoxy-type or any other suitable material. Encapsulant 218 envelopes electrical connections formed between wire bonds 220, the flex circuit 216, and actuating beam 240 and is configured to protect the wire bonds 220 from physical damage, moisture and corrosion. Thus, encapsulant 218 ensures the maintenance of an adequate electrical connection between flex circuit 216 and actuating beams 240 to facilitate providing electrical control signals to actuating beams 240 to cause movement thereof to open and close micro-valve 230.

The second arm 332 serves as a barrier preventing fluid contained in the reservoir 300 from reaching the electrical connections. As such, input fluid manifold 210 serves as both part of the reservoir 300 for pressured fluid received from an external fluid supply and an insulating barrier between the pressured fluids and any electrical connections contained within jetting assembly 200. First and second channels 212 and 214 may be formed using any suitable process (e.g., via sandblasting, physical or chemical etching, drilling, etc.). In some embodiments, rather than being constructed of glass, input fluid manifold 210 is constructed of silicon, silica, ceramics or any other suitable material. In some embodiments, the input fluid manifold 210 may be bonded to the micro-valve 230 via glass frit, solder or any other suitable adhesive.

With continued reference to FIG. 5A, micro-valve 230 includes an orifice plate 250 attached to actuating beam 240. The orifice plate 250 may be formed from any suitable material, for example, glass, stainless steel, nickel, nickel with another layer of electroplated metal (e.g., stainless steel), polyimide (e.g., kapton) or a negative photoresist (e.g., SU-8, polymethylmethacrylate, etc.). In some embodiments, the orifice plate 250 may be substantially flat, for example, have a flatness with a coefficient of variance of less than 3 microns over a length and width of the orifice plate 250 of at least 15 mm, such that the orifice plate 250 is substantially free of bow or twist. Furthermore, the orifice plate 250 may have any suitable thickness. In some embodiments, the orifice plate 250 may have a thickness in a range of 30 microns to 60 microns (30, 40, 50, or 60 microns). In other embodiments, the orifice plate 250 may have a thickness in a range of 100 microns to 400 microns (e.g., 100, 150, 200, 250, 300, 350, or 400 microns). Thicker orifice plates 250 may facilitate realization of a flatter orifice plate.

Orifice plate 250 is substantially planar and includes an orifice 260 extending between surfaces thereof. In various embodiments, the orifice 260 is substantially cylindrical-shaped and has a central axis that is perpendicular or substantially perpendicular to surfaces of orifice plate 250. A valve seat 270 is disposed on an internal surface 316 of orifice plate 250 proximate to orifice 260. In various embodiments, valve seat 270 comprises a compliant material that surrounds or substantially surrounds orifice 260. In some embodiments, valve seat 270 is constructed from an epoxy-based adhesive such as an SU-8 photoresist. In other embodiments, the valve seat may be formed from a moldable polymer, for example, polydimethylsiloxane or silicone rubber. In still other embodiments, the valve seat 270 may be formed from a non-compliant material such as silicon. In some embodiments, a compliant layer, for example, a gold layer may be disposed on a surface of the valve seat 270 which is contacted by the actuating beam 240. Valve seat 270 defies an interior opening 318 substantially aligned with orifice 260 to create an outlet for pressured fluid contained in the reservoir 300. In particular embodiments, the valve seat 270 might be excluded.

As shown, the actuating beam 240 extends a distance between a first end 336 and a second end 338. Actuating beam 240 includes an end portion 328 extending from the first end 336 to a boundary of the second channel 214. As shown, the end portion 328 is attached (e.g., via an adhesive layer) to the input fluid manifold 210 via a surface of the first arm 330. The end portion 328 is disposed on spacing member 280. As such, the end portion 328 is sandwiched between the spacing member 280 and the first arm 330. In various embodiments, the end portion 328 includes each of the layers described with respect to FIGS. 7A-B extending continuously therethrough. However, in alternative embodiments, any of the layers described with respect to FIGS. 7A-B may not be included or include any number of discontinuities within the end portion 328.

Actuating beam 240 further includes an electrical connection portion 294 extending from the end portion 328. As shown, the electrical connection portion 294 extends in a region that corresponds to the second channel 214. In other words, electrical connection portion 294 is located between the spacing member 280 and the channel 214. As shown, the wire bond 220 connects to the actuating beam 240 via the electrical connection portion 294. As described herein, the actuating beam 240 has a bonding pad disposed thereon at the electrical connection portion 294 to form an electrical connection. Via the electrical connection, an electrical signal originating from an external controller travels to the actuating beam 240 via the flex circuit 216 and wire bond 220. As described herein, the electrical signal may result in movement of a cantilevered portion 308 of the actuating beam 240 from a default position. Such a movement may open the fluid outlet defined at the orifice 260 such that fluid contained in the reservoir 300 is ejected from the valve body 298 and onto a desired surface. Various aspects of the electrical connection portion 294 are structured to facilitate operation of the micro-valve 230 in response to the electrical signal. Such aspects are described in greater detail with respect to FIG. 8A-B.

Actuating beam 240 further includes a base portion 306 extending from the electrical connection portion 294 to a boundary of the second arm 332. As such, input fluid manifold 210 is attached to the actuating beam 240 via an adhesive disposed between the base portion 306 and the second arm 332. In some embodiments, each of the layers described with respect to FIGS. 7A-B extends continuously through the base portion 306. In alternative embodiments, one or more of the layers described with respect to FIGS. 7A-B may not be present within the base portion 306. For example, in one embodiment, the passivation structure 406 and the second electrode portion 404 are not present within the base portion 306. In such an embodiment, the adhesive attaching the actuating beam 240 to the second arm 332 directly contacts the layer of piezoelectric material within the base portion 306. Alternatively, or additionally, any of the layers described with respect to FIGS. 7A-B may include one or more discontinuities (e.g., vias) within the base portion 306.

The cantilevered portion 308 extends from the base portion 306 into the reservoir 300. Since the base portion 306 is disposed on a spacing member 280, the cantilevered portion 308 is spatially separated from orifice plate 250. Thus, since the cantilevered portion 308 extends into the reservoir 300, there is space on either side of cantilevered portion 308 such that it may bend toward and/or away from the orifice plate 250 as a result of application of the electrical signal thereto via electrical connection portion 294. The spacing member 280 is configured to prevent squeeze film damping of the actuating beam.

Cantilevered portion 308 has a length 312 such that the cantilevered portion 308 extends from a boundary of the reservoir 300 by a predetermined distance. In various embodiments, the predetermined distance is specifically selected such that a portion 292 of cantilevered portion 308 overlaps the valve seat 270 and orifice 260. A sealing member 290 extends from the portion 292 of the actuating beam 240 overlapping orifice 260. In some embodiments, sealing member 290 is constructed to have a shape that substantially corresponds to a shape of orifice 260. For example, in one embodiment, both orifice 260 and sealing member 290 are substantially cylindrical-shaped, with sealing member 290 having a larger outer diameter. Such a configuration facilitates sealing member 290 covering orifice 260 in its entirety to enable a seal to be formed between sealing member 290 and valve seat 270. In other embodiments, the orifice 260 may have any other shape, e.g., star shape, square, rectangular, polygonal, elliptical or an asymmetric shape. In particular embodiments, the valve seat 270 may define a recess size and shaped to receive the sealing member 290. In various embodiments, the orifice plate 250 and therefore, the orifice 260 may be formed from a non-wetting (e.g., hydrophobic) material such as silicon or Teflon. In other embodiments, a non-wetting (e.g., hydrophobic) coating may be disposed on an inner wall of the orifice 260. Such coatings may include, for example, Teflon, nanoparticles, an oleophilic coating or any other suitable coating.

In various embodiments, spacing member 280 and sealing member 290 are constructed of the same materials and have equivalent or substantially equivalent thicknesses 320 and 322 (e.g., silicon, SU-8, silicon rubber, polymethylmethacrylate, etc.). In such embodiments, when actuating beam 240 extends parallel to orifice plate 250, lower surfaces of spacing member 280 and sealing member 290 are aligned with one another. When actuating beam 240 is placed into a closed position (as described herein), a surface of sealing member 290 contacts valve seat 270 to close the fluid outlet formed at orifice 260 (e.g., a sealing surface of the sealing member 290 may be configured to extend approximately 2 microns beneath a lower surface of spacing member 280 if the valve seat 270 was not present). Valve seat 270 and sealing member 290 may be dimensioned such that sufficient surface area of the sealing member 290 contacts valve seat 270 when actuating beam 240 is placed in the closed position (e.g., when an electrical signal is removed from or applied to actuating beam 240 via wire bonds 220) to prevent fluid from traveling from reservoir 300 to orifice 260. For example, the sealing member 290 may have a larger diameter or otherwise cross-section than the valve seat 270. In some embodiments, a compliant material (e.g., a gold layer) maybe disposed on a surface of the sealing member 290 that is configured to contact the valve seat 270.

Various aspects of the structure of the cantilevered portion 308 are constructed to maximize the durability of the micro-valve 230. In some embodiments, the second electrode portion 404 described with respect to FIGS. 7A-B extends continuously through substantially the entirety of the cantilevered portion 308. Such a structure provides maximal overlap between the top electrode and a layer of piezoelectric material within the cantilevered portion 308 such that electric signal may be applied to substantially the entirety of the cantilevered portion to maximize the piezoelectric response. Because the cantilevered portion 308 extends into the reservoir 300, the fluid contained within the reservoir 300 will contact the actuating beam 240. The fluid contained within the reservoir 300 (e.g., any suitable combination of ink and makeup fluid) may corrode various materials out of which the actuating beam 240 is constructed. For example, in some embodiments, the electrodes contained in the actuating beam (e.g., the top electrode (hereon referred as "second electrode") in the second electrode portion 404 described with respect to FIGS. 7A-B) may be constructed of a material (e.g., platinum) that corrodes in response to contact with the fluid. Thus, to ensure durability of the micro-valve, steps are taken to isolate the electrodes from the fluid. For example, the passivation structure 406 described with respect to FIGS. 7A-B may be disposed on the second electrode such that the passivation structure 406 completely covers the second electrode.

To allow this to occur, the actuating beam 240 may be constructed such that a delimiting (e.g., outer circumferential) boundary of the second electrode is disposed inward of a delimiting boundary of the actuating beam 240. For example, the layer of piezoelectric material contained within the actuating beam 240 may extend outward of the second electrode, and the passivation structure 406 may be disposed on the second electrode such that the passivation structure 406 completely covers the second electrode. In other words, an end 340 of the cantilevered portion 308 may not include the second electrode layer to facilitate complete passivation of the actuating beam 240. Such a structure is described in greater detail with respect to FIGS. 7B, 9 and 10.

Various aspects of jetting assembly 200 are designed to ensure formation of an adequate seal between valve seat 270 and sealing member 290. For example, structural layer 222 disposed on input fluid manifold 210 prevents bowing of orifice plate 250 resulting from stressed induced thereon via adhesives coupling components of micro-valve 230 to one another and the micro-valve 230 to housing portion 206. In various embodiments, structural layer 222 is constructed to have a greater rigidity than orifice plate 250 to perform this function. Structural layer 222 may be constructed of silicon or any other suitable material. As shown, structural layer 222 includes protruding portions 224 extending from a main portion thereof. Protruding portions 224 are attached to an upper surface of input fluid manifold 210 (e.g., at boundaries of first and second channels 212 and 214). In certain embodiments, protruding portions 224 are omitted. A seal is formed at protruding portions 224 via, for example, an adhesive disposed between structural layer 222 and flex circuit 216. Protruding portions 224 provide clearance above the input fluid manifold 210. Such clearance facilitates disposal of encapsulant 218 that completely covers all points of contact between wire bond 220 and flex circuit 216. In some embodiments, the carrier 202 may include the structural layer 222 such that the stiffness is provided by the carrier 202.

In another aspect, actuating beam 240 is constructed such that a tight seal is formed at the interface between the valve seat 270 and the sealing member 290 when in the closed position. Actuating beam 240 may include at least one layer of piezoelectric material. The layer of piezoelectric material may include lead zirconate titanate (PZT) or any suitable material. The layer of piezoelectric material has electrodes electrically connected thereto. In various embodiments, wire bonds 220 are attached to said electrodes such that electrical signals from flex circuit 216 are provided to the layer of piezoelectric material via the electrodes. The electrical signals cause the actuating beam 240 to move (e.g., bend, turn, curve, etc.) with respect to its default position. In other embodiments, the actuating beam 240 may include a stainless steel actuating beam (e.g., having a length of approximately 1 mm). In still other embodiments, the actuating beam 240 may include a bimorph beam having a two layers of a piezoelectric material disposed on either side of a base layer (e.g., a base silicon layer). An electrical signal (e.g., an electrical voltage) may be applied to either one of the piezoelectric layers so as to urge the actuating beam to bend toward the corresponding piezoelectric layer. The two piezoelectric layers may include the same piezoelectric material or different piezoelectric materials. In particular embodiments, a different electrical signal may be applied to each of the piezoelectric layer so as to bend or curve the actuating beam a predetermined distance.

As shown, wire bonds 220 are attached to actuating beam 240 at an electrical connection portion 294 thereof. Electrical connection portion 294 includes a bonding pad (e.g., constructed of gold, platinum, rubidium, etc.) conductively connected to at least one electrode within actuating beam 240. Beneficially, electrical connection portion 294 is separated from the cantilevered portion of actuating beam 240. In other words, electrical connection portion 294 is separated from the fluid contained in jetting assembly 200 via seals formed at the points of connection between input fluid manifold 210 and actuating beam 240. In some embodiments, the wire bonds 220 and/or the encapsulant 218 may be routed out through an opening provided in the orifice plate 250.

In various embodiments, actuating beam 240 is constructed such that the closed position is its default position. In other words, various layers in the actuating beam 240 are constructed such that the actuating beam curves toward orifice 260 as a result of force supplied via pressured fluid contained in the reservoir. A tuning layer within actuating beam 240 may be constructed to be in a state of compressive stress to cause a curvature in actuating beam toward the orifice. As a result of such curvature, sealing member 290 contacts valve seat 270, for example, in the absence of any electrical signals applied to the actuating beam 240 to close the fluid outlet. The degree of curvature may be specifically selected to form a tight seal at the interface between sealing member 290 and valve seat 270 with the actuating beam 240 in the default position. Beneficially, such a default seal prevents evaporation of the fluid contained in jetting assembly 200, which prevents clogging and other defects.

The actuating beam 240, as shown in FIG. 5A, is bent away from orifice plate 250. Accomplishment of such a bend results from application of an electrical signal to actuating beam 240 via flex circuit 216. For example, flex circuit 216 may be electrically connected to an external controller supplying electrical signals relayed to actuating beam 240.

As illustrated by FIG. 5A, application of the electrical signal causes the actuating beam 240 to temporarily depart from its default position. For example, in various embodiments, the actuating beam 240 moves upward away from orifice 260 such that a portion of a sealing member surface of sealing member 290 is at least 10 microns from an upper surface of valve seat 270. In one embodiment, a central portion of the sealing member surface is approximately 15 microns from the valve seat 270 at a peak of its oscillatory pattern. As a result, an opening is temporarily formed between valve seat 270 and sealing member 290. The opening provides a pathway for a volume of fluid to enter orifice 260 to form a droplet at an exterior surface of the orifice plate 250. The droplets are deposited onto a substrate to form a pattern determined via the control signals supplied to each of the actuating beams 240 of each of the micro-valves 230 of jetting assembly 200. As will be appreciated, the frequency with which the actuating beam 240 departs from its default position to a position such as the one shown in FIG. 5A may vary depending on the implementation. For example, in one embodiment, the actuating beam 240 oscillates at a frequency of approximately 12 kHz. However, the actuating beam 240 may oscillate at a smaller (e.g., 10 kHz) or larger frequency (e.g., 20 kHz) in other implementations.

Figure 5B:
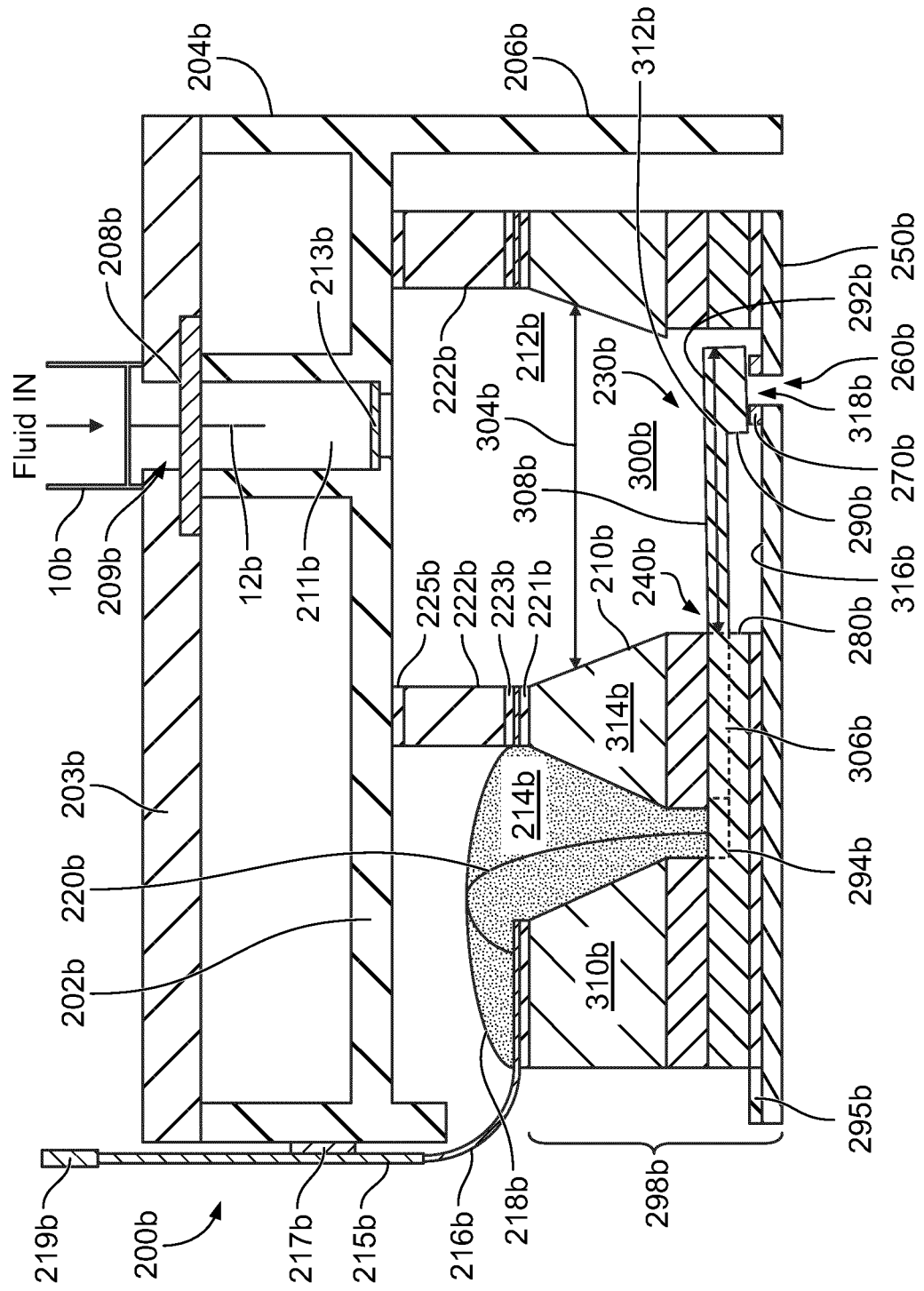
FIG. 5B is a-cross sectional view of a jetting assembly including a micro-valve, according to another example embodiment.

Referring now to FIG. 5B, a cross sectional view of a jetting assembly 200b including a micro-valve 230b is shown, according to an example embodiment. In some embodiments, jetting assembly 200b is an example embodiment of the jetting assembly 100 described with respect to FIGS. 1, 2, 3, and 4A-4B. As shown, jetting assembly 200b includes a carrier 202b attached to a valve body 298b via an interposer 222b.

Carrier 202b includes an upper portion 204b and a housing portion 206b extending from an edge of upper portion 204b. A fluid channel 211b is provided in the upper portion 204b. A septum 208b (e.g., a rubber or foam septum) is positioned at an inlet of the fluid channel 211b and a filter 213b is positioned at an outlet of the fluid channel 211b. A cover 203b (e.g., a plastic or glass cover) is positioned on the carrier 202b such that the septum 208b is positioned between the carrier 202b and the cover 203b, and secured therebetween. An opening 209b may be defined in the cover 203b and corresponds to the inlet of the fluid channel 211b. A fluid connector 10b is coupled to the cover 203b or the inlet of the fluid channel 211b. The fluid connector 10b includes an insertion needle 12b configured to pierce the septum 208b and be disposed therethrough in the fluid channel 211b. The fluid connector 10b is configured to pump pressurized fluid (e.g., ink) into an input fluid manifold 210b of the jetting assembly 200b via the insertion needle 12b. Furthermore, the filter 213b is configured to filter particles from the fluid before the fluid is communicated into the reservoir 300b. In some embodiments, the insertion needle 12b may be formed from or coated with a non-wetting (e.g., a hydrophobic material such as Teflon). In other embodiment, the insertion needle 12b may include heating elements, or an electric current may be provided to the insertion needle 12b so as to heat the insertion needle 12b and thereby, the fluid flowing therethrough into the reservoir 300b. In still other embodiments, metallic needles or any other heating element may be provided in the input fluid manifold 210b for heating the fluid contained therein. While shown as only including the fluid channel 211b, in some embodiments, the carrier 202b may also define a second fluid channel for allowing the fluid to be drawn out of the carrier 202b, i.e., cause the fluid to be circulated through the carrier 202b.

The housing portion 206b defines a cavity or a boundary within which the valve body 298b is disposed. Valve body 298b includes the input fluid manifold 210b and the micro-valve 230b. As shown, input fluid manifold 210b and micro-valve 230b define the reservoir 300b configured to hold a volume of pressured fluid received from an external fluid supply via the septum 208b. In various embodiments, the pressurized fluid held within the reservoir 300b is a combination of an ink and additional fluids in a liquid state.

In various embodiments, input fluid manifold 210b is pre-formed prior to its attachment to the additional components of the jetting assembly 200b. Fluid manifold 210b may be formed by a glass body 310b having any suitable thickness (e.g., 500 microns). As shown, input fluid manifold 210b is pre-formed to include a first channel 212b and a second channel 214b. First channel 212b is formed to have a width 304b bearing a predetermined relationship to a length 312b of a cantilevered portion 308b of an actuating beam 240b of the micro-valve 230b. Second channel 214b provides an avenue for an electrical connection to be formed between the actuating beam 240b and a flex circuit 216b via wire bonds 220b extending in between.

As shown, second channel 214b is substantially filled with an encapsulant 218b. The encapsulant 218b ensures the maintenance of an adequate electrical connection between flex circuit 216b and actuating beams 240b to facilitate providing electrical control signals to actuating beams 240b to cause movement thereof to open and close micro-valve 230b, and protects a wire bond 220b from physical damage or moisture, as previously described herein.

The portion 314b of input fluid manifold 210b separating the first and second channels 212b and 214b serves as a barrier preventing fluid contained in the reservoir 300b from reaching the electrical connections. As such, input fluid manifold 210b serves as both part of the reservoir 300b for pressured fluid received from an external fluid supply and an insulating barrier between the pressured fluids and any electrical connections contained within jetting assembly 200b.

The micro-valve 230b includes an orifice plate 250b attached to actuating beam 240b. Orifice plate 250b is substantially planar and includes an orifice 260b extending between surfaces thereof. A valve seat 270b is disposed on an internal surface 316b of orifice plate 250b proximate to orifice 260b. Valve seat 270b defies an interior opening 318b substantially aligned with orifice 260b to create an outlet for pressured fluid contained in the reservoir 300b. In particular embodiments, the valve seat 270b might be excluded. In some embodiments, the orifice plate 250b or any other orifice plate described herein may also be grounded. For example, an electrical ground connector 295b (e.g., a bonding pad such as a gold bond pad) may be provided on the orifice plate 250b and configured to allow the orifice plate 250b to be electrically ground (e.g., via electrical coupling to a system ground).

The actuating beam 240b includes a base portion 306b and a cantilevered portion 308b. Base portion 306b extends underneath the portion 314b of input fluid manifold 210b separating the first and second channels 212b and 214b. As shown, the base portion 306 includes an electrical connection portion 294b in a region that overlaps with the second channel 214b. Electrical connection portion 294b includes an electrode through which an electrical connection is formed with flex circuit 216b via wire bonds 220b. The cantilevered portion 308b extends into the reservoir 300b from the portion 314b of input fluid manifold 210b. As shown, cantilevered portion 308b is disposed on a spacing member 280b and, as a result, is spatially separated from orifice plate 250b.

Cantilevered portion 308b has a length 312b such that the cantilevered portion extends from a boundary of the reservoir 300b by a predetermined distance. In various embodiments, the predetermined distance is specifically selected such that a portion 292b of cantilevered portion 308b overlaps the valve seat 270b and orifice 260b. A sealing member 290b extends from the portion 292b of the actuating beam 240b overlapping the orifice 260b. In some embodiments, sealing member 290b is constructed to have a shape that substantially corresponds to a shape of orifice 260b.

The flex circuit 216b is positioned on the glass body 310b and the portion 314b of the input fluid manifold 210b, and coupled thereto via a first adhesive layer (e.g., SU-8, silicone rubber, glue, epoxy, etc.). An interposer 222b is positioned between the upper portion 204b of the carrier 202b and the input fluid manifold 210b so as to create gap between the upper portion 204b and the input fluid manifold 210b. This allows sufficient space for disposing the encapsulant 218b and increases a volume of the input fluid manifold 210b. As shown in FIG. 5B, the interposer 222b is positioned on and coupled to a portion of the flex circuit 216b via a second adhesive layer 223b (e.g., SU-8, silicone, or any other adhesive). Furthermore, the interposer 222b is coupled to a side wall of the upper portion 204b of the carrier 202b proximate to the micro-valve 230b via a third adhesive layer 225b (e.g., SU-8, silicone, or any other adhesive).

The interposer 222b may be formed from a strong and rigid material (e.g., plastic, silicon, glass, ceramics, etc.) and disposed on input fluid manifold 210b so as to prevent bowing of the orifice plate 250b resulting from stressed induced thereon via adhesives coupling components of micro-valve 230b to one another and the micro-valve 230b to housing portion 206b. In various embodiments, interposer 222b is constructed to have a greater rigidity than orifice plate 250b to perform this function.

In another aspect, actuating beam 240b is constructed such that a tight seal is formed at the interface between valve seat 270b and sealing member 290b when in the closed position. Actuating beam 240b may include at least one layer of piezoelectric material (e.g., lead zirconate titanate (PZT) or any suitable material). The layer of piezoelectric material has electrodes electrically connected thereto and wire bonds 220b are attached to said electrodes such that electrical signals from flex circuit 216b are provided to the layer of piezoelectric material via the electrodes. The electrical signals cause the actuating beam 240b to move (e.g., bend, turn, etc.) with respect to its default position.

As shown, wire bonds 220b are attached to actuating beam 240b at an electrical connection portion 294b thereof, substantially similar to the wire bonds 220 described with respect to the jetting assembly 200 of FIG. 5A. In various embodiments, actuating beam 240b is constructed such that the closed position is its default position, as described in detail with respect to the actuating beam 240 of FIG. 5A.

The actuating beam 240b, as shown in FIG. 5B, is bent away from orifice plate 250b. Accomplishment of such a bend results from application of an electrical signal to actuating beam 240b via flex circuit 216b. For example, flex circuit 216b may be electrically connected to a circuit board 215b (e.g., a printed circuit board) extending perpendicular to a longitudinal axis of the actuating beam 240b along a sidewall of the carrier 202b. An identification tag 217b (e.g., the identification tag 106) may be positioned between the circuit board 215b and the sidewall of the carrier 202b. An electrical connector 219b is electrically coupled to the circuit board 215b and configured to electrically connect the flex circuit 216b to an external controller supplying electrical signals relayed to actuating beam 240b via the circuit board 215b.

As illustrated by FIG. 5B, application of the electrical signal causes the actuating beam 240b to temporarily depart from its default position. For example, in various embodiments, the actuating beam 240b moves upward away from orifice 260b such that a portion of a sealing surface of sealing member 290b is at least 10 microns from an upper surface of valve seat 270b, as described in detail with respect to the actuating beam 240 of FIG. 5A.

Figure 6:
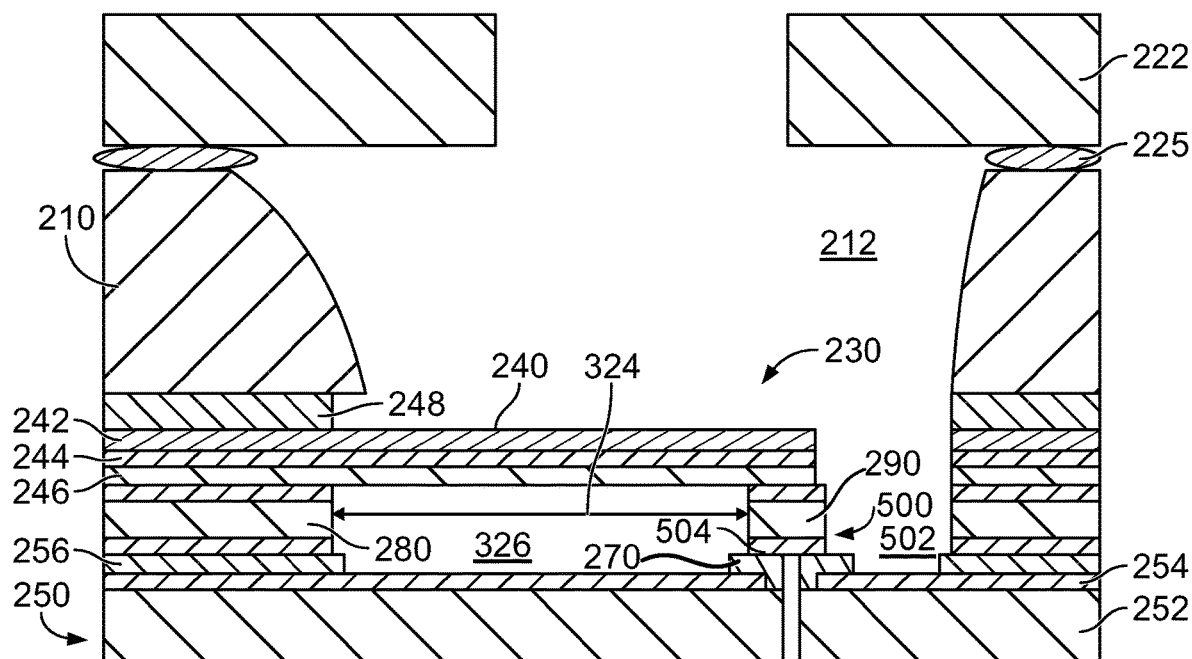
FIG. 6 is cross-sectional view providing a more detailed view of the jetting assembly shown in FIG. 5A.

Referring now to FIG. 6, a more detailed view showing various components of jetting assembly 200 described with respect to FIG. 5A-B is shown, according to an exemplary embodiment. As shown, actuating beam 240 includes an actuating portion 242, a tuning layer 244, and a non-active layer 246. Non-active layer 246 serves as a base for the tuning layer 244 and the actuating portion 242. The structure of actuating portion 242 and the tuning layer 244 are described in greater detail with respect to FIG. 7. In some embodiments, the non-active layer 246 is constructed from silicon or other suitable material. In some embodiments, the non-active layer 246, the spacing member 280, and the sealing member 290 are all constructed from the same material (e.g., monolithically formed from a silicon wafer). In an example embodiment, non-active layer 246, the spacing member 280, and sealing member 290 are formed from a double silicon-on-insulator (SOI) wafer. The SOI wafer may comprise a first silicon layer located between a first silicon dioxide layer silicon dioxide and a second silicon dioxide layer, a second silicon layer located between the second silicon dioxide layer and a third silicon dioxide layer, and a base layer located below the third silicon dioxide layer.

Spacing member 280 is shown to include an intermediate layer interposed between two peripheral layers. In an example embodiment, the intermediate layer and non-active layer 246 comprise two silicon layers of a double SOI wafer, with the peripheral layers disposed on either side of the intermediate layer including silicon oxide layers. In this example, the sealing member 290 and spacing member 280 are formed through etching the surface of the double SOI wafer opposite the actuating portion 242. Oxide layers serve to control or stop the etching process once, for example, the entirety of the intermediate layer forming the spacing member 280 is removed in a region separating the spacing member 280 and sealing member 290. Such a process provides precise control over both the width and thickness of the spacing and sealing members 280 and 290.

As will be appreciated, the size of sealing member 290 may contribute to the resonance frequency of actuating beam 240. Larger amounts of material disposed at or near an end of actuating beam 240 generally results in a lower resonance frequency of actuating beam. Additionally, such larger amounts of material will impact the actuating beam's 240 default curvature induced from pressurized fluid contacting actuating beam 240. Accordingly, the desired size of sealing member 290 impacts various other design choices of actuating beam 240. Such design choices are described in greater detail with respect to FIG. 7A. In some embodiments, the sealing member 290 is sized based on the dimensions of orifice 260. In some embodiments, the sealing member 290 is substantially cylindrical and has a diameter approximately 1.5 times that of the orifice 260. For example, in one embodiment, sealing member 290 has a diameter of approximately 90 microns when the orifice 260 has a diameter of approximately 60 microns. Such a configuration facilitates alignment between sealing member 290 and orifice 260 such that sealing member 290 completely covers orifice 260 upon contacting valve seat 270. In another embodiment, the sealing member 290 is sized such that it has a surface area that approximately doubles that of the orifice 260 (e.g., the spacing member 280 may have a diameter of approximately 150 microns, with the orifice 260 being approximately 75 microns in diameter). Such an embodiment provides greater tolerance for aligning sealing member 290 and orifice 260 to facilitate creating the seal between valve seat 270 and sealing member 290. In other embodiments, the diameter of the sealing member 290 may be 2 times, 2.5 times, 3 times, 3.5 times or 4 times to the diameter of the orifice 260. In various embodiments, a ratio of a length to diameter of the orifice 260 may be in range of 1:1 to 15:1. The ratio may influence shape, size and/or volume of a fluid droplet ejected through the orifice and may be varies based on a particular application.

Beneficially, the via 324 between spacing member 280 and sealing member 290 creates a volume of separation 326 between actuating beam 240 and orifice plate 250. The volume of separation 326 prevents squeeze film damping of oscillations of actuating beam 240. In other words, insufficient separation between orifice plate 250 and actuating beam 240 would lead to drag resulting from fluid having to enter and/or exit the volume of separation 326 as the actuating beam 240 opens and closes the orifice 260. Having the greater volume of separation produced via spacing member 280 reduces such drag and therefore facilitates actuating beam 240 oscillating at faster frequencies.

With continued reference to FIG. 6, orifice plate 250 includes a base layer 252 and intermediate layer 254. For example, in one embodiment, base layer 252 comprises a silicon layer and intermediate layer 254 includes a silicon oxide layer. In the embodiment shown, a portion of the intermediate layer 254 proximate to orifice 260 is removed and a first portion of the valve seat 270 is disposed directly on base layer 252 and a second portion of the valve seat 270 is disposed on the intermediate layer 254. It should be understood that, in alternative embodiments, intermediate layer 254 extends all the way to boundaries of orifice 260 and valve seat 270 is disposed on intermediate layer 254. In still other embodiments, the removed portion of the intermediate layer 254 may have a cross-section equal to or greater than a cross-section of the valve seat 270 such that the valve seat 270 is disposed entirely on the base layer 252.

Due to the criticality of the spatial relationship between spacing member 280 and valve seat 270, attachment of spacing member 280 to orifice plate 250 may be performed in a manner allowing precise control over the resulting distance between actuating beam 240 and orifice plate 250. As shown, an adhesive layer 256 is used to attach spacing member 280 to orifice plate 250. In various embodiments, a precise amount of epoxy-based adhesive (e.g., SU-8, polymethylmethacrylate, silicone, etc.) is applied to intermediate layer 254 prior to placement of the combination of spacing member 280 and actuating beam 240 thereon. The adhesive is then cured to form an adhesive layer 256 having a precisely controlled thickness. For example, in some embodiments, a lower-most surface of spacing member 280 is substantially aligned with an upper surface of valve seat 270. Any desired relationship between such surfaces may be obtained to create a relationship between sealing member 290 and valve seat 270 that creates an adequate seal when actuating beam 240 is in the default position. In various embodiments, the adhesive layer 256 and the valve seat 270 may be formed from the same material (e.g., SU-8) in a single photolithographic process.

In various embodiments, once the actuating beam 240 and orifice plate 250 are attached to one another via adhesive layer 256 (e.g., to form micro-valve 230), an additional adhesive layer 248 is applied to the periphery of the actuating beam 240. The additional adhesive layer 248 is used to attach input fluid manifold 210 to actuating beam 240. The structural layer 222 (or the interposer 222b) may be positioned on the input fluid manifold 210 and coupled thereto via a second adhesive layer 225. In some embodiments, the additional adhesive layer 248 and the second adhesive layer 225 may include the same material as the adhesive layer 256.

In the example shown with respect to FIG. 6, the micro-valve 230 includes a sealing structure 500 including various components through which a seal is formed to separate the orifice 260 from a volume proximate the actuating beam 240. In the example shown, the sealing structure 500 includes the sealing member 290 and the valve seat 270. As described herein, the actuating beam 240 is configured such that an orifice-facing surface of the sealing member 290 contacts an upper surface of the valve seat 270 to form a seal at the interface between the valve seat 270 and the sealing member 290. The seal isolates the orifice 260 from the channel 212 such that minimal fluid escapes the jetting assembly 200 when no electrical signals are applied to the actuating beam 240. In other embodiments, the valve seat 270 may be excluded such that the orifice facing surface of the sealing structure 500 contacts the orifice plate 250 so as to fluidly seal the orifice 260.

Figure 7A:
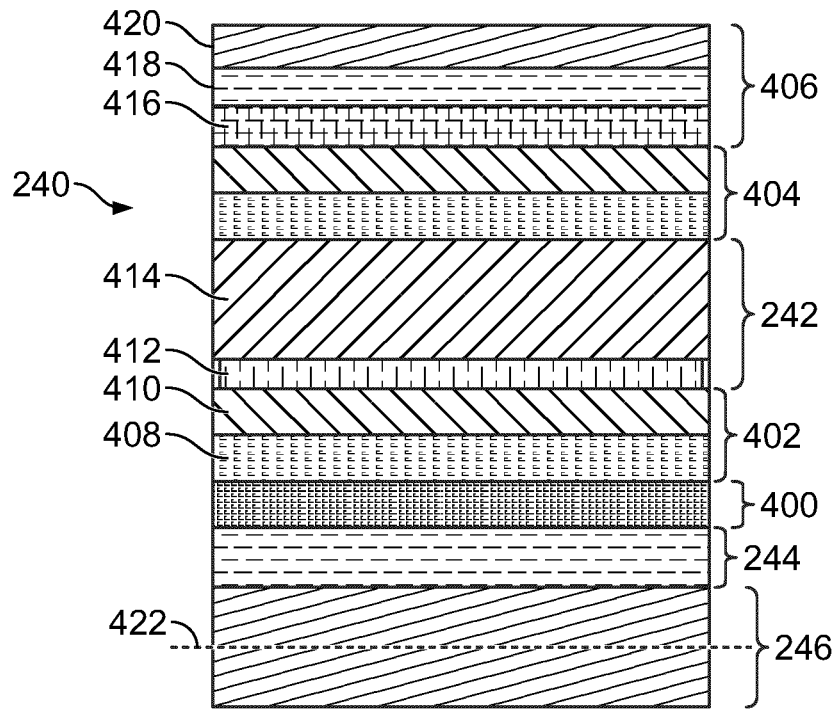
FIG. 7A is a cross-sectional view of an actuating beam of a micro-valve, according to an example embodiment.

Referring now to FIG. 7A, a more detailed view of actuating beam 240 is shown, according to an example embodiment and not to scale. As shown, actuating beam 240 may include a base layer comprising the non-active layer 246, the tuning layer 244 and a barrier layer 400, a first electrode portion 402, the actuating portion 242, a second electrode portion 404, and a passivation structure 406. As will be appreciated, actuating beam 240 may include more or fewer layers in various alternative embodiments.

In some embodiments, tuning layer 244 is disposed directly on non-active layer 246. Tuning layer 244 generally serves as an adhesion layer for facilitating deposition of the additional layers described herein. Additionally, as described herein, a thickness of tuning layer 244 may play a critical role in determining an overall curvature in actuating beam 240 when in its default position. Speaking generally, tuning layer 244 is configured to have a predetermined tuning stress such that in the closed position, the sealing member 290 of the actuating beam 240 contacts and exerts a force on the valve seat 270 so as to fluidly seal the orifice 260. In some embodiments, in the absence of an electrical signal, the predetermined tuning stress is configured to cause the actuating beam 240 to curve toward the orifice 260 such that in the absence of the valve seat 270, the sealing member surface of the sealing member 290 would be positioned a predetermined distance (e.g., 2 microns) beneath a lower surface of the spacing member 280. For example, the tuning layer 244 may be placed into a state of compressive stress as a result of the deposition of the additional layers described herein. As such, the thicker tuning layer 244 is, the greater curvature of actuating beam 240 toward orifice 260 when in its default position. In one example embodiment, the tuning layer 244 is constructed of silicon dioxide.

Barrier layer 400 acts as a barrier against diffusion of materials contained in the first electrode portion 402 to the tuning layer 244. If left unchecked, such migration will lead to harmful mixing effects between constituent materials in the layers, adversely impacting performance. In various embodiments, barrier layer 400 is constructed of, for example, zirconium dioxide. As shown, first electrode portion 402 includes an adhesion layer 408 and a first electrode 410. The adhesion layer 408 facilitates deposition of the first electrode 410 on barrier layer 400 and prevents diffusion of matter in the first electrode 410 to other layers. In various embodiments, adhesion layer 408 is constructed of titanium dioxide. First electrode 410 may be constructed of platinum, gold, rubidium, or any other suitable conductive material to provide a conductive pathway for electrical signals to be provided to actuating portion 242. In some embodiments, first electrode portion 402 is only included in select portions of actuating beam 240. For example, first electrode portion 402 may only be included proximate to and/or within the electrical connection portion 294.

Actuating portion 242 may be formed from a single or multiple layers of any suitable piezoelectric material. In the example shown, active portion includes a growth template layer 412 and a piezoelectric layer 414. Growth template layer 412 serves as a seed layer facilitating growth of the piezoelectric layer 414 having a desired texture (e.g., the {001} texture crystal structure and corresponding texture) to ensure maximal piezoelectric response. In some embodiments, growth template layer 412 is constructed of lead titanate. Piezoelectric layer 414 may be constructed of any suitable material, such as lead zirconate titanate (PZT).

Piezoelectric layer 414 may be deposited using any method, such as, utilizing vacuum deposition or sol-gel deposition techniques. In some embodiments, piezoelectric layer 414 may have a thickness in a range of approximately 1-6 microns (e.g., 1, 2, 3, 4, 5, or 6 microns, inclusive) and is adapted to produce a deflection at an end of actuating beam 240 of approximately 10 microns when an electrical signal is applied thereto. A deflection of 10 microns (e.g., such that a surface of sealing member 290 departs from valve seat 270 by slightly less than that amount) may be sufficient to produce droplets at orifice 260 having a desired size. In some embodiments, piezoelectric layer 414 has a piezoelectric transverse coefficient (d31 value) magnitude of approximately 140 to 160 pm/V. This value may enable adequate deflection of actuating beam 240 to be generated via electrical signals supplied to first and second electrode portions 402 and 404.

As shown, second electrode portion 404 is disposed on actuating portion 242. In various embodiments, second electrode portion 404 is structured similarly to first electrode portion 402 described herein. Application of a voltage to the first electrode portion 402 and/or second electrode portion 404 thus induces a strain in piezoelectric layer 414, causing the cantilevered portion 308 to bend away from the orifice plate 250. Through application of periodic control signals to first and second electrode portions 402 and 404, periodic cycling of actuating beam 240 generates droplets output from orifice 260 at a desired frequency. While FIG. 7A shows the first and second electrode portions 402 and 404 overlapping each other, in other locations, the first and second electrode portions 402 and 404 may not overlap. This may limit or prevent electron leakage between the first and second electrode portions 402 and 404 which can damage the piezoelectric layer 414 or cause electrical shorts.

In various embodiments, the electrodes contained in first and second electrode portions 402 and 404 are deposited in a non-annealed state. As a result, the electrodes are deposited in a substantially compressive state, which impacts the overall curvature of actuating beam 240 when in a default position. The mode of deposition of piezoelectric layer 414 may impact the compressive state of the electrodes. For example, in some circumstances, where the piezoelectric layer 414 is deposited (e.g., via a vapor deposition technique) and later cured at a predetermined temperature (e.g., approximately 700 degrees C.), the curing may cause the electrode 410 to anneal and become removed from the compressive state. Such a removal impacts the overall balancing of stresses in actuating beam 240, which changes its default curvature. Accordingly, it may be beneficial to use a low-temperature deposition process for piezoelectric layer 414 (e.g., a low-temperature sol-gel deposition process or plasma-enhanced chemical vapor deposition process) to prevent the reversal of stresses in the electrodes. In various embodiments, second electrode portion 404 may be annealed at a higher temperature than the first electrode portion 402, for example, to create a predetermined tuning stress in the tuning layer 244.

The materials shown in FIG. 7A may extend substantially entirely through the length of actuating beam 240. As such, there is an overlap between electrode portions 402 and 404 and the reservoir formed via micro-valve 230. In various embodiments, the fluid contained in the reservoir is electrically conductive and/or corrosive to the materials forming the first and second electrode portions 402 and 404. Thus, it is preferable to isolate electrode portions 402 and 404 from the reservoir to prevent the fluid contained in the reservoir from contacting electrode portions 402 and 404.

In this regard, the passivation structure 406 is configured to perform such isolation. In the example shown, passivation structure 406 includes a dielectric layer 416, an insulator layer 418, and a barrier layer 420. Barrier layer 420 may be constructed of silicon nitride, which acts as a diffusion barrier against water molecules and ions contained in the fluid to prevent corrosion of electrode portions 402 and 404. In some embodiments, insulator layer 418 includes a silicon dioxide layer having a compressive stress that roughly counterbalances the tensile stress in the barrier layer 420. Dielectric layer 416 may be constructed of aluminum oxide to prevent oxidation of the additional layers contained in actuating beam 240. In some embodiments, an additional metal layer is disposed on barrier layer 420. For example, the metal layer may be constructed of Talinum oxide or any other suitable, chemically-resistant metal to further enhanced the protective properties of passivation structure 406. In particular embodiments, the barrier layer 420 may be formed from Teflon or parylene. In other embodiments, at least a portion of the actuating beam 240, i.e., the structure formed by the layers shown in FIG. 7A may be covered or over coated by a Teflon or parylene layer. Such an overcoat may prevent micro-cracks from forming in the layers of the actuating beam 240. In still other embodiments, the over coat may include a metallic layer, for example, a tantalum or palladium layer.

The addition of passivation structure 406 may significantly impact the default positioning of actuating beam 240. This is so because passivation structure 406 is offset from a neutral axis 422 of compression of the actuating beam 240. As shown, the neutral axis 422 is within the non-active layer 246, which means that the electrode portion 404 and passivation structure 406 are the most distant therefrom in actuating beam 240. Given this, the tensile or compressive stresses induced in such layers will greatly influence the default curvature of actuating beam 240. As such, the thickness of tuning layer 244 is selected based on the structure of various constituent layers of passivation structure 406.

Figure 7B:
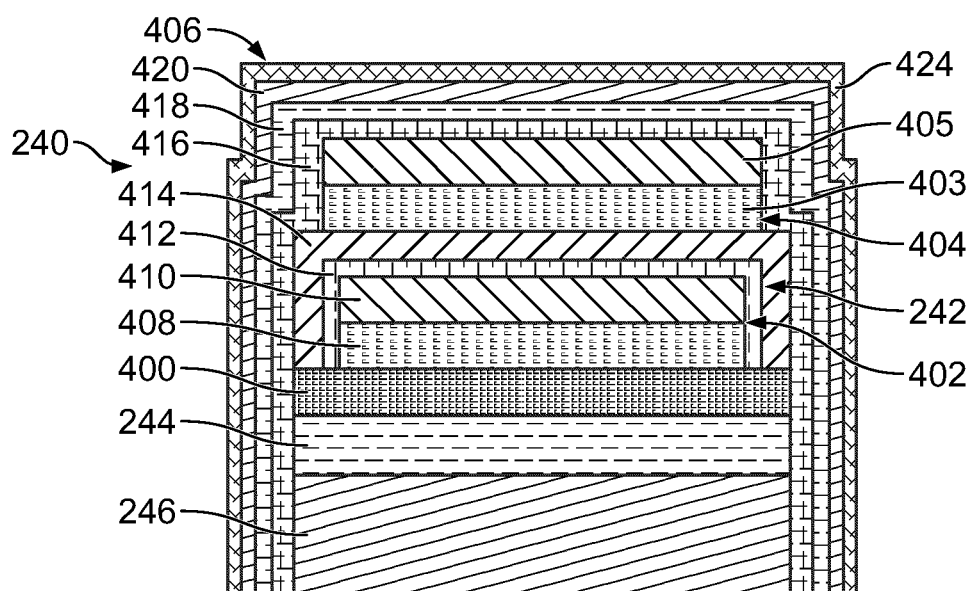
FIG. 7B is a front cross-sectional view of the actuating beam of FIG. 7A, according to another example embodiment.

FIG. 7B is front cross-sectional view of the actuating beam 240 showing an arrangement of each of the layers included in the actuating beam 240, according to an example embodiment and not to scale. As shown, actuating beam 240 includes the non-active layer 246, the tuning layer 244 and a barrier layer 400, as described with respect to FIG. 7A. The first electrode portion 402 includes the adhesion layer 408 (e.g., titanium) positioned on the barrier layer 400, and a conductive layer or electrode 410 (e.g., platinum, gold, rubidium) positioned thereon. The first electrode portion 402 is configured to have a width which is less than a width of the barrier layer 400 such that ends of the electrode portion 402 in a direction perpendicular to a longitudinal axis of the actuating beam 240 are located inwards of the ends of the barrier layer 400 in the same direction.

The actuating portion 242 including the seed layer 412 and the piezoelectric layer 414 is conformally disposed on the first electrode portion 402 so as to extend beyond the lateral ends of the first electrode portion 402 and contact the barrier layer 400. In this manner the piezoelectric layer completely surrounds or encapsulates at least the portion of the first electrode portion 402 which overlaps or is proximate to the second electrode portion 404. The second electrode portion 404 includes an adhesion layer 403 (e.g., titanium) and a conductive layer 405 (e.g., platinum, gold, or rubidium). In some embodiments, the second electrode portion 404 may include only the conductive layer 405 disposed directly on the piezoelectric layer 414 (i.e., the adhesion layer 403 is omitted). Since the actuating portion 242 overlaps and extends beyond the ends of the first electrode portion 402, the actuating portion effectively electrically isolates the first electrode portion 402 from the second electrode portion 404, so as to prevent electron leakage and current migration which may be detrimental to the performance of the actuating beam 240.

The passivation structure 406 conformally coats exposed portions of each of the other layers 246, 244, 400, 402, 242 and 404. However, a bottom surface of the non-active layer 246 may not be coated with the passivation structure 406. The passivation structure 406 may include a dielectric layer 416, an insulator layer 418, a barrier layer 420, and a top passivation layer 424. Barrier layer 420 may be constructed of silicon nitride, which acts as a diffusion barrier against water molecules and ions contained in the fluid to prevent corrosion of electrode portions 402 and 404. Silicon nitride, however, is generally in a state of tensile stress once deposited on the remaining layer. Insulator layer 418 is configured to counterbalance such tensile stress. For example, in some embodiments, insulator layer 418 includes a silicon dioxide layer having a compressive stress that roughly counterbalances the tensile stress in barrier layer 420. In various embodiments, the barrier layer 420 may be positioned beneath the insulator layer 418. Dielectric layer 416 may be constructed of aluminum oxide, titanium oxide, zirconium oxide or zinc oxide to prevent oxidation of the additional layers contained in actuating beam 240. Thus, passivation structure 406 serves to prevent both corrosion and oxidation—two major sources of defects caused by the presence of fluids—in actuating beam 240, and thus ensures long-term performance of micro-valve 230. Furthermore, the top passivation layer 424 is disposed on the barrier layer 420 and may include a Teflon or parylene layer. Such an overcoat may prevent micro-cracks from forming in the layers of the actuating beam 240, and may also prevent the underlying layer from a plasma discharge (e.g., which the buried layers may be exposed to in subsequent fabrication operations). In particular embodiments, the top passivation layer 424 may include a metallic layer, for example, a tantalum or palladium layer. In some embodiments, an additional metal layer is disposed on barrier layer 420. For example, the metal layer may be constructed of Talinum oxide or any other suitable, chemically-resistant metal to further enhanced the protective properties of passivation structure 406.

Referring now to FIG. 8A, a cross-sectional view of a first electrical connection portion 294 within the second channel 214 or 214b described with respect to FIG. 5A-B is shown, according to an exemplary embodiment. The first cross-section is taken along a first location of the micro-valve 230 at which a portion of a top electrode layer 404 (also referred to herein as "second electrode layer 404") is active, i.e., is involved in actuating the actuating beam 240, so as to form a top electrode which is electrically coupled to a wire bond 220. The active top electrode extends toward the cantilevered portion 308 from the electrical connection portion 294. As shown, the electrical connection portion 294 is disposed on the spacing member 280. The spacing member 280 is disposed on the orifice plate 250 described with respect to FIGS. 5A-B and 6. In the example shown, the actuating beam 240 includes a first end and a second end. The actuating beam 240 includes a base layer 245 comprising the non-active layer 246 and the tuning layer 244 that extend continuously through the entirety of the electrical connection portion 294, and the barrier layer 400. Such an arrangement simplifies construction of the micro-valve 230 as it facilitates the formation of the actuating beam from a double SOI wafer. However, alternative embodiments are envisioned. For example, in some alternative embodiments, vias may be formed in the tuning layer 244 and/or non-active layer 246. The layer of piezoelectric material 414 is disposed on the base layer 245 and extends a portion of a distance between the first end and the second end. A first via 802 and a second via 804 is defined through the layer 414 and the growth-template or seed layer 412 at the electrical connection portion 294.

In the depicted embodiment, certain layers of the actuating beam 240 are not included in certain regions of the electrical connection portion 294. For example, as shown, the second electrode layer 404 is only included in an electrode region 800 of the electrical connection portion 294. In various embodiments, the electrode region 800 is disposed more proximate to the base portion 306 than the end portion 328 of the actuating beam 240. As such, regions of the electrical connection portion 294 proximate to the end portion 328 do not include the second electrode layer 404. In the example shown, the bottom electrode layer 402 (hereon referred to as "first electrode layer 402") is only disposed in a limited segment of the electrode region 800. At the first location shown in FIG. 8A, a portion of the bottom electrode layer 402 disposed beneath the first via 802 is inactive, i.e., plays no part in activation of the actuating beam 240. For example, during the fabrication process, the portion of the bottom electrode layer 402 disposed below the first via 802 at the first location may be structured so as to be physically disconnected and thereby, electrically disconnected from an active portion of the bottom electrode layer 402 located at a second location of the micro-valve 230 where the bottom electrode layer 402 forms a bottom electrode extending into the cantilevered portion 308, as described in further detail below. Thus, within this limited segment, the actuating beam 240 includes a greater number of layers than any other segment of the actuating beam 240. As a result, the actuating beam 240 may have a maximal thickness within the electrode region 800.

As shown, within the electrical connection portion 294, the piezoelectric layer 414 includes the first via 802 and the second via 804. In the example shown, additional layers of the actuating beam 240 may also include vias that coextend with the first and second vias 802 and 804. For example, as shown, the growth template layer 412 also include vias that correspond to the first via 802 in the piezoelectric layer. Such vias may be formed, for example, after the piezoelectric layer 414 is formed on the growth template layer 412. For example, an etching mask may be disposed on the piezoelectric layer 414 and an etchant may be applied to the piezoelectric layer 414 such that portions of the layers 412, and 414 are removed in positions that correspond to the first via 802. As previously described herein, the portion of the bottom electrode layer 402 is disposed beneath the first via 802. A portion of the top electrode layer 404 is disposed through the first via 802 and located above inactive portion of the bottom electrode portion 402.

The second via 804 is defined through the layer of the piezoelectric material 414 to the base layer 245. A bonding pad 806 is disposed on the actuating beam 240 such that at least a portion of the bonding pad 806 is disposed through the second via 804 on the base layer 245. The bonding pad 806 is configured to receive a wire bond 220. In some embodiments, the second via 804 may be defined through the barrier layer 400 such that the bonding pad 806 is deposited on the tuning layer 244. The tuning layer 244 may be substantially more rigid than the layer of piezoelectric material 414 and the barrier layer 400 and may provide a significantly more rigid and robust surface for the bonding pad 806 to receive the wire bond 220 thereon. As shown in FIG. 8A, the bonding pad 806 includes a main portion 808 disposed within the first via 802 and a bonding pad lead 810 disposed on an upper surface of the piezoelectric layer 414. For example, after the first via 802 and the second via 804 are formed, the bonding pad 806 may be deposited on the piezoelectric layer 414 and over the second via 804 using any suitable technique. In various embodiments, the wire bond pad 806 is constructed of gold using a suitable deposition method (e.g., sputtering, thermal evaporation, electron-beam evaporation, sol-gel coating, etc.). While the main portion 808 is deposited on base layer 245 within the second via 804, the bonding pad lead 810 is disposed over the layer of piezoelectric material 414. A portion of the bonding pad lead 810 is disposed on the top electrode portion 404 at the first via 802 so as to be electrically connected thereto.

As a result of the portion of the first and second electrode layers 402 and 404 being contained within the electrode region 800 (or not extending beyond a boundary of the first via 802), neither the portions of the first electrode layer 402 or the second electrode 404 overlap with the main portion 808. Beneficially, such a structure reduces strain placed on the electrode layers 402, 404 as a result of deposition of the wire bond pad 806 and connection of the wire bond 220 to wire bond pad 806. As described with respect to FIG. 7A-B, the electrode layers contained in the electrode portion 402 and 404 may be deposited in a non-annealed state having compressive stress. Deposition of the main portion 808 of the wire bond pad 806 thereon may alter the compressive state of the electrode layers 402, 404, changing the balance of stresses in the actuating beam 240, thereby affecting its default position. The first via 802 facilitates isolation of the main portion 808 from the electrode layers 402, 404 to thereby reduce this effect, and thus ensures the actuating beam 240 having a desired default position.

In the example shown, additional layers of the actuating beam 240 include vias at positions that correspond to the second via 804. The growth template layer 412 includes such a via in the depicted embodiment. As such, vias in the actuating beam (e.g., in positions corresponding to the first and second vias 802 and 804) may extend through differing numbers of constituent layers of the actuating beam 240. At the second via 804, for example, both the growth template layer 412 and the barrier layer 400 include corresponding vias. At the first via 802, however, only the growth template layer includes such a corresponding via.

A portion of the first electrode layer 402 is positioned beneath the first via 802. As shown, the portion of the first electrode layer 402 is substantially centered with respect to the second via 804 and is slightly larger than the second via 804. As such, portions of the layers 412 and 414, and all layers disposed thereon (e.g., such as the second electrode layer 404, wire bond pad 806, and passivation structure 406), may be slanted at the circumferential boundary of the first electrode layer 402. At the first location where the first cross-section of FIG. 8A is taken, the portion of the first electrode layer 402 does not extend to the cantilevered portion 308, and therefore plays no role in biasing the piezoelectric layer 414 at the first location (i.e., is electrically inactive).

The second electrode layer 404 extends across the first via 802 such that the portion of the second electrode portion 404 is disposed within the first via 802. In other words, at the first via 802, the first and second electrodes layers 402, 404 are closer to one another than at other positions within the electrical connection portion 294. At positions exterior to the first via 802, for example, the first electrode layer is disposed on a first (e.g., lower) side of the piezoelectric layer 414 and the second electrode layer is disposed on a second (e.g., upper) side of the piezoelectric layer 414. In the depicted embodiment, within the first via 802, the first and second electrode layers 402 and 404 are separated by no more than an adhesion layer (similar to the adhesion layer 408 described with respect to FIGS. 7A-B) of the second electrode layer 404. As described before, at the first location, the portion of the top electrode layer is active and forms a top electrode. An extending portion 407 of the top electrode extends outwards from the portion of the second electrode layer 404 onto the cantilevered portion 308 and is configured to convey electrical signal from the main portion 808 to a portion of the piezoelectric layer 414 positioned on the cantilevered portion 308.

The bonding pad lead 810 of the wire bonding pad extends over an upper surface of the piezoelectric layer 414 and across the first via 802. In the example shown, the bonding pad lead 810 extends over the portion of the second electrode layer 404 across the first via 802. The contact area between the bonding pad lead 810 and the portion of the second electrode layer 404 creates an electrical connection through which an electric signal may be delivered to the piezoelectric layer 414 via the wire bond 220. As described herein, the second electrode layer 404 may extend from the electrode region 800 across the base portion of the actuating beam 240 (e.g., such as the base portion 306 described with respect to FIGS. 5A-B) and substantially all of the cantilevered portion (e.g., such as the cantilevered portion 308 described with respect to FIGS. 5A-B). Thus, the electrical signal provided via the electrical connection at the bonding pad lead 810 facilitates an electrical signal being delivered to substantially the entirety of the cantilevered portion, thus facilitating an efficient piezoelectric response.

As shown, the passivation structure 406 is disposed on the piezoelectric layer 414. In various embodiment, after the bonding pad 806 is formed (e.g., after formation of the first and second vias 802 and 804), the passivation structure is disposed on the actuating beam 240 via any suitable deposition technique. As shown, the passivation structure 406 includes a via positioned in manner that roughly corresponds with the first via 802. Such a via in the passivation structure 406 provides a location for the wire bond 220. The via in the passivation structure 406 may be formed after the passivation structure 406 is disposed in a manner such that the passivation structure 406 completely covers the electrical connection portion 294 (e.g., via etching or any other suitable cutting technique). As shown, the passivation structure 406 completely covers the second electrode layer 404 to prevent corrosion.

FIG. 8B is a cross-sectional view of a second electrical connection portion 294b, which may also be included in the micro-valve assembly within the second channel 214 described with respect to FIGS. 5A-B, according to an exemplary embodiment. The cross-section is taken along a second location of the micro-valve 230 at which a portion of the bottom electrode layer 402 (also referred to herein as "first electrode layer 402") is electrically coupled to a second wire bond 220b. As shown, the electrical connection portion 294b is disposed on the spacing member 280.

As shown, within the second electrical connection portion 294b, the piezoelectric layer 414 includes a first via 802b and a second via 804b. A second bonding pad 806b is disposed on the actuating beam 240. The second bonding pad 806b is configured to provide an electrical signal (e.g., a current or voltage) to the portion of the first electrode portion 402 located in the second electrical connection portion 294b. As shown, the second bonding pad 806b includes a main portion 808b disposed within the first via 802b and a bonding pad lead 810b disposed on an upper surface of the piezoelectric layer 414. Expanding further, at the second location, the portion of the bottom electrode layer 402 positioned beneath the first via 802 is active so as to form a bottom electrode. Furthermore, the portion of the second electrode layer 404 disposed within the first via 802b above the active portion of the bottom electrode layer 402 is inactive, i.e., takes no part in actuating the actuating beam 240. For example, during the fabrication process, the portion of the top electrode layer 404 disposed in the first via 802b may be structured so as to be physically disconnected and thereby, electrically disconnected from the active portion of the top electrode layer 404 located at the first location of the micro-valve 230 where the top electrode layer 404 extends into the cantilevered portion, as previously described herein. A portion of the bonding pad lead 810b is disposed on the inactive portion of the top electrode layer 404 at the first via 802b so as to be electrically connected to the active portion of the bottom electrode layer 402 through the inactive portion of the top electrode layer 404, and in some embodiments, also through a second adhesion layer interposed between the portions of the first and second electrode layers 402 and 404.

As a result of the portions of the electrode layers 402 and 404 being contained within the electrode region 800b (or not extending beyond a boundary of the first via 802), neither the first electrode layer 402 or the second electrode layer 404 overlap with the main portion 808b. A portion of the first electrode layer 402 is disposed beneath the first via 802b. As shown, the portion first electrode layer 402 is substantially centered with respect to the first via 802b and is slightly larger than the first via 802b. As such, portions of the layers 412 and 414, and all layers disposed thereon (e.g., such as the second electrode layer 404 and the second bonding pad 806b, and passivation structure 406b), may be slanted at the circumferential boundary of the first electrode layer 402. The second electrical connection portion 294b is similar to the electrical connection portion 294, apart from the following differences. At the second location where the second cross-section of FIG. 8B is taken, the second electrode layer 404 does not extend to the cantilevered portion 308, and therefore plays no role in biasing the piezoelectric layer 414 at the second location. However, a first electrode extending portion 403b extends outwards from the portion first electrode layer 402 onto the cantilevered portion 308 and is configured to convey electrical signal from the second main portion 808b to a portion of the piezoelectric layer 414 positioned on the cantilevered portion 308.

In some embodiments, a differential electrical signal (e.g., differential voltage) may be applied between the active portions of the first electrode layer 402 and the second electrode layer 404 so as to open or close the micro-valve. For example, the actuating beam 240 may be configured to close the orifice 260 of the orifice plate 262 when no electrical signal is applied to the active portions of the first and second electrode layers 402 and 404 (i.e., in the default position) as previously described herein. Application of the electrical signal may bias the piezoelectric layer 414 causing the actuating beam 240 such that the cantilevered portion 308 bends away from the orifice 260, thereby opening the micro-valve. The electrical signal may be applied to any one of the first electrode layer 402 or the second electrode layer 404, and the other one of the first electrode layer 402 and the second electrode layer 404 electrically coupled to an electrical ground (e.g., a common ground).

Figure 9:
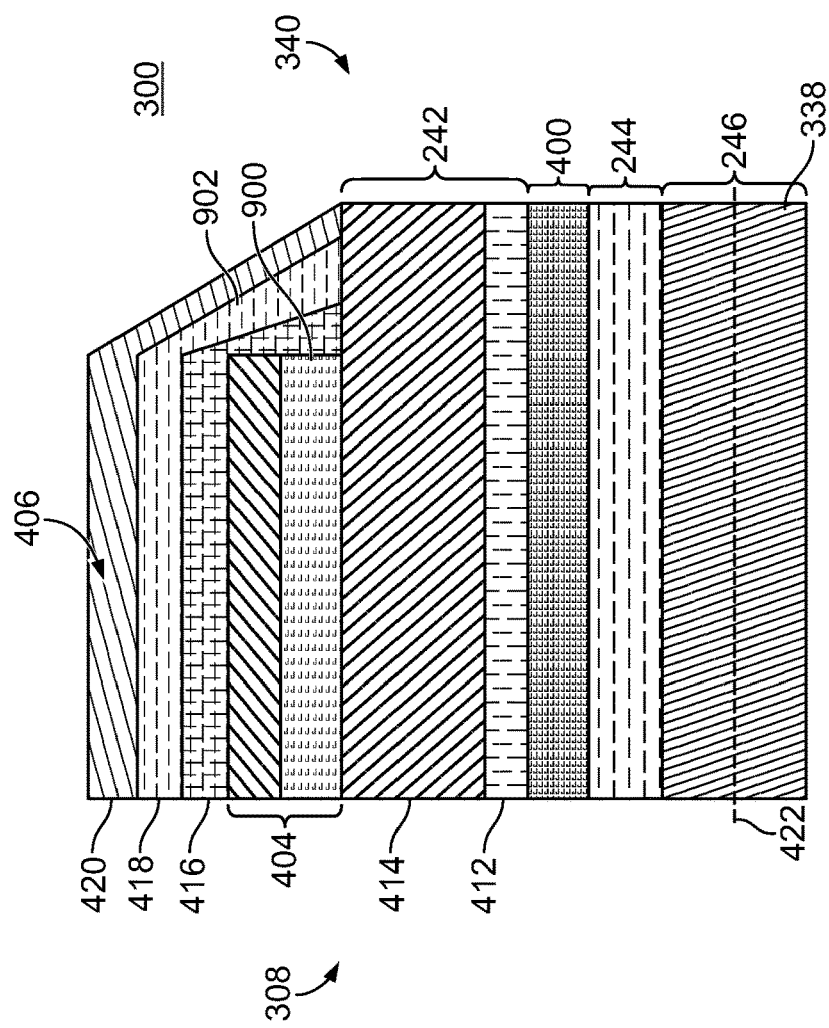
FIG. 9 is a cross sectional view of an end of an actuating beam of a micro-valve, according to an example embodiment.

Referring now to FIG. 9, a cross-sectional view of the end 340 of the cantilevered portion 308 of the actuating beam

240 is shown, according to an exemplary embodiment. As shown, the second electrode portion 404 extends almost to the second end 338 of the actuating beam 240. However, a circumferential boundary 900 of the electrode portion 404 lies inward of the second end 338. As a result, when the passivation structure 406 is disposed on the second electrode portion 404, a slanted portion 902 of the passivation structure 406 is formed at the second end 338. In other embodiments, the passivation structure 406 may be conformally coated on the constituent layers of the actuating beam 240 at the second end 338. As shown, the end 340 of the second electrode portion 404 is fluidly isolated from the reservoir 300 via the slanted portion 902. If the second electrode portion 404 extended all the way to the second end 138, a face delimiting the circumferential boundary 900 would be exposed to the reservoir 300 and corrosion of the second electrode portion 404 would result. As will be appreciated, the slanted portion 902 may not be limited to the second end 338, but extend around substantially the entirety of the outer circumference of the cantilevered portion 308.

It should be appreciated that the slanted portion 902 may take alternative forms than that depicted in FIG. 9. While slanted portion 902 is depicted as being substantially-linearly sloped, it should be appreciated that the slanted portion 902 may have a curved or rounded form in alternative embodiments. Generally, the slanted portion 902 may be described as an end portion of the passivation structure 406 that wraps around a second electrode portion 402.

Figure 10:
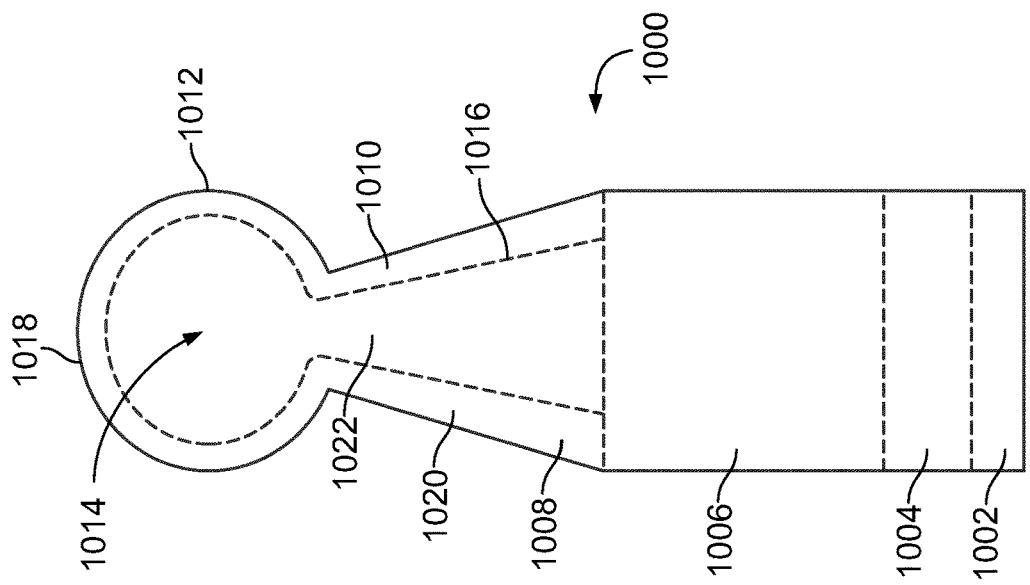
FIG. 10 is a plan view of an actuating beam of a micro-valve, according to an example embodiment.

Referring now to FIG. 10, a plan view of an actuating beam 1000 of a micro-valve is shown, according to an example embodiment. Actuating beam 1000 may be constructed in a manner similar to the actuating beam 240 described herein. As shown, the actuating beam 1000 includes an end portion 1002, an electrical connection portion 1004 extending from the end portion 1002, a base portion 1006 extending from the electrical connection portion 1004, and a cantilevered portion 1008 extending form the base portion. In an example, when disposed in a micro-valve, the end portion 1002 and the base portion 1006 are attached to an input fluid manifold via an adhesive. The electrical connection portion 1004 may be aligned with an opening in the input fluid manifold to provide space for a wire bond to connect the actuating beam to an external circuit board. The electrical connection portion 1004 may be constructed in a manner similar to the electrical connection portion 294 described herein. The cantilevered portion 1008 may extend into a reservoir defined by the input fluid manifold and the micro-valve, and move in response to an electrical signal being received via the electrical connection portion 1004.

The cantilevered portion 1008 is shown to include an extending portion 1010 and a sealing portion 1012. The extending portion 1010 extends from the base portion 1006 and is substantially trapezoidal-shaped. Such a trapezoidal shape may improve the operating frequency of the incorporating micro-valve due to decreased fluid resistance. The sealing portion 1012 is substantially circular-shaped, and may have a sealing member disposed thereon to form a seal at a valve seat, as described herein.

As shown, the actuating beam 1000 includes a layer of piezoelectric material 1020 and an electrode 1014. The electrode 1014 is disposed on the layer of piezoelectric material 1020 (e.g., in a manner similar to that described with respect to the second electrode portion 404 in the description of FIGS. 8A-B and 9). As shown, the electrode 1014 includes an extending portion 1022 disposed on the cantilevered portion 1008. The extending portion 1022 has a circumferential boundary 1016 disposed inward of a circumferential boundary 1018 of the actuating beam 1000. Such a structure facilitates the formation of an end portion of a passivation structure at the boundary of the actuating beam 1000 to completely isolate outer surfaces of the electrode 1014 from any fluid that the cantilevered portion 1008 may encounter. Such a structure reduces the corrosion of the electrode and extends the durability of the incorporating micro-valve. Furthermore, the electrode 1014 may be communicatively coupled to a first portion of the piezoelectric material 1020 that is disposed on the cantilevered portion 1008 that is movable, but is not coupled to a second portion of the piezoelectric material 1020 that is disposed on the immovable base portion 1006 of the actuating beam 1000. This may prevent the second portion piezoelectric material 1020 from being actuated when an activating signal (e.g., a differential voltage) is provided to the piezoelectric material 1020 via the electrode 1014. Since the second portion of the piezoelectric material 1020 is immovable, application of an activating signal may crack the piezoelectric material 1020. Therefore, designing the electrode 1014 to only contact the movable first portion of the piezoelectric material 1020 prevents inadvertent failure of the piezoelectric layer.

In some embodiments, a micro-valve comprises: an orifice plate including an orifice; an actuating beam including a first end and a second end, wherein the actuating beam further comprises: a base layer; a layer of piezoelectric material disposed on the base layer and extending at least a portion of a distance between the first end and the second end, the layer of piezoelectric material defining a via therethrough at an electrical connection portion thereof; a bottom electrode layer disposed on a first side of the layer of piezoelectric material at the electrical connection portion thereof, a portion of the bottom electrode layer disposed beneath the via; and a top electrode layer disposed on a second side of the layer of piezoelectric material at the electrical connection portion thereof, a portion of the top electrode layer disposed through the via, wherein the actuating beam includes a base portion extending from the electrical connection portion toward the first end and a cantilevered portion extending from the base portion toward the second end, wherein the cantilevered portion is movable in response to application of a differential electrical signal between the bottom electrode layer and the top electrode layer to one of open or close the micro-valve.

In some embodiments, the micro-valve further comprises a valve seat disposed on the orifice plate, the valve seat defining an opening in fluid communication with orifice and a fluid plenum.

In some embodiments, the via is a first via, and wherein at the electrical connection portion of the actuating beam, the layer of piezoelectric material includes a second via defined therethrough to the base layer, wherein the micro-valve further comprises a bonding pad, at least a portion of the bonding pad disposed through the second via on the base layer and configured to receive a wire bond. In some embodiments, the bonding pad comprises a bonding pad lead electrically connected to at least one of the portion of the bottom electrode layer or the portion of the top electrode layer at the first via.

In some embodiments, at a first location of the electrical connection portion, the portion of the bottom electrode layer disposed beneath is inactive, and the portion of the top electrode layer is active so as to form a top electrode, the top electrode extending toward the cantilevered portion from the electrical connection portion, and wherein a portion of the bonding pad lead is disposed on the portion of the top electrode layer at the first via so as to be electrically connected thereto.

In some embodiments, at a second location of the electrical connection portion, the portion of the top electrode layer is inactive, and the portion of the bottom electrode layer is active so as to form a bottom electrode, the bottom electrode extending toward the cantilevered portion from the electrical connection portion, and wherein a portion of the bonding pad lead is disposed on the inactive portion of the top electrode layer at the first via so as to be electrically connected to the active bottom electrode through the inactive portion of the top electrode layer.

In some embodiments, the micro-valve further comprises a spacing member disposed on the orifice plate, wherein the electrical connection portion and base portion are disposed on the spacing member.

In some embodiments, the base layer comprises a tuning layer and barrier layer at least a portion of which is interposed between the tuning layer and the layer of piezoelectric material, wherein the second via extends through the barrier layer such that the bonding pad contacts the tuning layer. In some embodiments, the bonding pad is constructed of gold.

In some embodiments, at the electrical connection portion, the actuating beam comprises a first adhesion layer disposed under the bottom electrode and a second adhesion layer disposed under the top electrode, wherein the first adhesion layer is co-extensive with the bottom electrode and the second adhesion layer is co-extensive with the top electrode. In some embodiments, the first via, the bottom electrode layer and the top electrode are separated by no more than the second adhesion layer.

In some embodiments, the actuating beam further comprises a passivation structure disposed on the layer of piezoelectric material, wherein the passivation structure completely covers the top electrode and the layer of piezoelectric material. In some embodiments, the passivation structure comprises an aluminum oxide layer, a silicon dioxide layer disposed on the aluminum oxide layer, and a silicon nitride layer disposed on the silicon dioxide layer.

In some embodiments, the top electrode layer extends continuously from the electrical connection portion across the base portion of the actuating beam, wherein the top electrode layer includes an extending portion disposed on the cantilevered portion. In some embodiments, a circumferential edge of the extending portion of the top electrode layer is inward of a circumferential edge of the layer of piezoelectric material such that the passivation structure directly contacts the layer of piezoelectric material outward of the circumferential edge of the extending portion.

In some embodiments, the bottom electrode layer extends continuously from the electrical connection portion across the base portion of the actuating beam, wherein the bottom electrode layer includes an extending portion disposed on the cantilevered portion. In some embodiments, the layer of piezoelectric material overlaps and extends beyond lateral ends of the bottom electrode layer such that the piezoelectric material encapsulates at least a portion of the bottom electrode layer.

In some embodiments, an overlapping portion of the cantilevered portion overlaps the orifice, wherein the micro-valve further comprises a sealing member extending from the overlapping portion toward the orifice, wherein, in the absence of the electrical signal, the sealing member contacts the valve seat to close the micro-valve. In some embodiments, the orifice and the sealing member are substantially cylindrical shaped, wherein the sealing member is substantially centered with respect to the orifice and has a diameter larger than that of the orifice such that the sealing member completely covers the orifice in the absence of the electrical signal.

In some embodiments, the cantilevered portion extends from the base portion toward the orifice a distance between 500 and 1,000 microns. In some embodiments, the cantilevered portion includes a first portion extending from the base portion and a second portion extending from the first portion, wherein the second portion is differently-shaped than the first portion. In some embodiments, a cross-section of the first portion is trapezoidal-shaped and a cross-section of the second portion is cylindrical-shaped.

In some embodiments, a micro-valve comprises: an orifice plate including an orifice; an actuating beam including a first end and a second end, wherein the actuating beam further comprises: a base layer; a layer of piezoelectric material disposed on the base layer and extending at least a portion of a distance between the first end and the second end, the layer of piezoelectric material defining a via therethrough to the base layer at an electrical connection portion thereof; a bottom electrode layer disposed on a first side of the layer of piezoelectric material at the electrical connection portion thereof; a top electrode layer disposed on a second side of the layer of piezoelectric material at the electrical connection portion thereof; and a bonding pad, at least a portion of the bonding pad disposed through the via on the base layer and configured to receive a wire bond, the bonding pad comprising a bonding pad lead electrically connected to at least one of the bottom electrode layer or the top electrode layer, wherein the actuating beam includes a base portion extending from the electrical connection portion toward the first end and a cantilevered portion extending from the base portion toward the second end, wherein the cantilevered portion is movable in response to application of a differential electrical signal between the bottom electrode and the top electrode to one of open or close the micro-valve.

In some embodiments, a jetting assembly comprises: a valve body comprising an orifice plate including a plurality of orifices extending therethrough; a plurality of micro-valves, wherein each of the plurality of micro-valves comprises: an actuating beam including a first end and a second end, wherein the actuating beam further comprises: a base layer; a layer of piezoelectric material disposed on the base layer and extending at least a portion of a distance between the first end and the second end, the layer of piezoelectric material defining a via therethrough at an electrical connection portion thereof; a bottom electrode layer disposed on a first side of the layer of piezoelectric material at the electrical connection portion thereof, a portion of the bottom electrode layer disposed beneath the via; and a top electrode layer disposed on a second side of the layer of piezoelectric material at the electrical connection portion thereof, a portion of the top electrode layer disposed through the via wherein the actuating beam includes a base portion extending from the electrical connection portion toward the first end and a cantilevered portion extending from the base portion toward the second end, wherein the cantilevered portion is movable in response to application of a differential electrical signal between the bottom electrode layer and the top electrode layer to one of open or close the micro-valve; and a fluid manifold coupled to each of the plurality of micro-valves to define a fluid reservoir for each of the plurality of micro-valves.

In some embodiments, each of the plurality of micro-valves further comprises a valve seat disposed on the orifice plate, the valve seat defining an opening in fluid communication with orifice and a fluid plenum. In some embodiments, the via is a first via, and wherein at the electrical connection portion of the actuating beam, the layer of piezoelectric material includes a second via defined therethrough to the base layer, wherein the micro-valve further comprises a bonding pad, at least a portion of the bonding pad disposed through the second via on the base layer and configured to receive a wire bond.

In some embodiments, the bonding pad is constructed of gold. In some embodiments, the bonding pad comprises a bonding pad lead electrically connected to at least one of the portion bottom electrode layer or the portion of the top electrode layer at the first via.

In some embodiments, at a first location of the electrical connection portion, the portion of the bottom electrode layer is inactive, and the portion of the top electrode layer is active so as to form a top electrode, the top electrode extending toward the cantilevered portion from the electrical connection portion, and wherein a portion of the wire bonding lead is disposed on the portion of the top electrode layer at the first via so as to be electrically connected thereto.

In some embodiments, at a second location of the electrical connection portion, the portion of the top electrode layer is inactive, and the portion of the bottom electrode layer is active so as to form a bottom electrode, the bottom electrode extending toward the cantilevered portion from the electrical connection portion, and wherein a portion of the wire bonding lead is disposed on the inactive portion of the top electrode layer at the first via so as to be electrically connected to the active bottom electrode through the inactive portion of the top electrode layer.

In some embodiments, at least a portion of the fluid manifold is disposed on an end portion of the actuating beam. In some embodiments, the fluid manifold is disposed between the plurality of micro-valves and a carrier, wherein the carrier substantially encloses a volume in which the fluid manifold and the plurality of micro-valves are disposed.

In some embodiments, the jetting assembly further comprises an interposer disposed between the fluid manifold and the carrier. In some embodiments, the jetting assembly further comprises a flex circuit disposed between the fluid manifold and the interposer, and a circuit board attached to a side surface of the carrier, wherein the flex circuit electrically connects the actuating beams of the plurality of micro-valves to the circuit board via wire bonds connected to the actuating beams at the electrical connection portion.

In some embodiments, each of the micro-valves further comprise a spacing member disposed on the orifice plate, wherein the electrical connection portion and the base portion are disposed on the spacing member.

In some embodiments, at the electrical connection portion, the actuating beam comprises a first adhesion layer disposed under the bottom electrode layer and a second adhesion layer disposed under the top electrode layer, wherein the first adhesion layer is co-extensive with the bottom electrode layer and the second adhesion layer is co-extensive with the top electrode layer.

In some embodiments, at the first via, the bottom electrode layer and the top electrode layer are separated by no more than the second adhesion layer. In some embodiments, the actuating beam further comprises a passivation structure disposed on the actuating beam, wherein the passivation structure completely covers the top electrode layer.

In some embodiments, the passivation structure comprises an aluminum oxide layer, a silicon dioxide layer disposed on the aluminum oxide layer, and a silicon nitride layer disposed on the silicon dioxide layer. In some embodiments, the top electrode layer extends continuously from the electrical connection portion across the base portion of the actuating beam, wherein the top electrode layer includes an extending portion disposed on the cantilevered portion.

In some embodiments, a circumferential edge of the extending portion of the top electrode layer is inward of a circumferential edge of the layer of piezoelectric material such that the passivation structure directly contacts the layer of piezoelectric material outward of the circumferential edge of the extending portion.

In some embodiments, the bottom electrode layer extends continuously from the electrical connection portion across the base portion of the actuating beam, wherein the bottom electrode layer includes an extending portion disposed on the cantilevered portion. In some embodiments, the layer of piezoelectric material overlaps and extends beyond lateral ends of the bottom electrode layer such that the layer of piezoelectric material encapsulates at least a portion of the bottom electrode layer.

As used herein, the term "approximately" generally mean plus or minus 10% of the stated value. For example, about 0.5 would include 0.45 and 0.55, about 10 would include 9 to 11, about 1000 would include 900 to 1100.

The terms "coupled," "connected," and the like, as used herein, mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

References herein to the positions of elements (e.g., "top," "bottom," "above," "below," etc.) are merely used to describe the orientation of various elements in the figures. It should be noted that the orientation of various elements may differ according to other exemplary embodiments, and that such variations are intended to be encompassed by the present disclosure.

The construction and arrangement of the elements as shown in the exemplary embodiments are illustrative only. Although only a few embodiments of the present disclosure have been described in detail, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements, the position of elements may be reversed or otherwise varied, and the nature or number of discrete elements or positions may be altered or varied.

Additionally, the word "exemplary" is used to mean serving as an example, instance, or illustration. Any embodiment or design described herein as "exemplary" or as an "example" is not necessarily to be construed as preferred or advantageous over other embodiments or designs (and such term is not intended to connote that such embodiments are necessarily extraordinary or superlative examples). Rather, use of the word "exemplary" is intended to present concepts in a concrete manner. Accordingly, all such modifications are intended to be included within the scope of the present disclosure. Other substitutions, modifications, changes, and omissions may be made in the design, operating conditions, and arrangement of the preferred and other exemplary embodiments without departing from the scope of the appended claims.

Other substitutions, modifications, changes and omissions may also be made in the design, operating conditions and arrangement of the various exemplary embodiments without departing from the scope of the present invention. For example, any element disclosed in one embodiment may be incorporated or utilized with any other embodiment disclosed herein. Also, for example, the order or sequence of any process or method steps may be varied or re-sequenced according to alternative embodiments. Any means-plus-function clause is intended to cover the structures described herein as performing the recited function and not only structural equivalents but also equivalent structures. Other substitutions, modifications, changes and omissions may be made in the design, operating configuration, and arrangement of the preferred and other exemplary embodiments without departing from the scope of the appended claims.

What is claimed is:

1. A micro-valve comprising:
   an orifice plate including an orifice;
   an actuating beam including a first end and a second end, wherein the actuating beam further comprises:
   a base layer;
   a layer of piezoelectric material disposed on the base layer and extending at least a portion of a distance between the first end and the second end, the layer of piezoelectric material defining a via therethrough at an electrical connection portion thereof;
   a bottom electrode layer disposed on a first side of the layer of piezoelectric material at the electrical connection portion thereof, a portion of the bottom electrode layer disposed beneath the via; and
   a top electrode layer disposed on a second side of the layer of piezoelectric material at the electrical connection portion thereof, a portion of the top electrode layer disposed through the via,
   wherein the actuating beam includes a base portion extending from the electrical connection portion toward the first end and a cantilevered portion extending from the base portion toward the second end, wherein the cantilevered portion is movable in response to application of a differential electrical signal between the bottom electrode layer and the top electrode layer to one of open or close the micro-valve; and
   wherein the actuating beam comprises a passivation structure disposed on the layer of piezoelectric material, wherein the passivation structure conformally coats the beam with the exception of the bottom surface of the actuating beam.

2. The micro-valve of claim 1, further comprising a valve seat disposed on the orifice plate, the valve seat defining an opening in fluid communication with orifice and a fluid plenum.

3. The micro-valve of claim 2, wherein an overlapping portion of the cantilevered portion overlaps the orifice, wherein the micro-valve further comprises a sealing member extending from the overlapping portion toward the orifice, wherein, in the absence of the electrical signal, the sealing member contacts the valve seat to close the micro-valve.

4. The micro-valve of claim 1, wherein the via is a first via, and wherein at the electrical connection portion of the actuating beam, the layer of piezoelectric material includes a second via defined therethrough to the base layer, wherein the micro-valve further comprises a bonding pad, at least a portion of the bonding pad disposed through the second via on the base layer.

5. The micro-valve of claim 4, wherein the bonding pad comprises a bonding pad lead electrically connected to at least one of the portion of the bottom electrode layer or the portion of the top electrode layer at the first via.

6. The micro-valve of claim 5, wherein at a first location of the electrical connection portion, the portion of the bottom electrode layer disposed beneath is inactive, and the portion of the top electrode layer is active so as to form a top electrode, the top electrode extending toward the cantilevered portion from the electrical connection portion, and wherein a portion of the bonding pad lead is disposed on the portion of the top electrode layer at the first via so as to be electrically connected thereto.

7. The micro-valve of claim 5, wherein at a second location of the electrical connection portion, the portion of the top electrode layer is inactive, and the portion of the bottom electrode layer is active so as to form a bottom electrode, the bottom electrode extending toward the cantilevered portion from the electrical connection portion, and wherein a portion of the bonding pad lead is disposed on the inactive portion of the top electrode layer at the first via so as to be electrically connected to the active bottom electrode through the inactive portion of the top electrode layer.

8. The micro-valve of claim 4, wherein the base layer comprises a tuning layer and barrier layer at least a portion of which is interposed between the tuning layer and the layer of piezoelectric material, wherein the second via extends through the barrier layer such that the bonding pad contacts the tuning layer.

9. The micro-valve of claim 1, wherein the bottom electrode layer extends continuously from the electrical connection portion across the base portion of the actuating beam, wherein the bottom electrode layer includes an extending portion disposed on the cantilevered portion.

10. The micro-valve of claim 9, wherein the layer of piezoelectric material overlaps and extends beyond lateral ends of the bottom electrode layer such that the piezoelectric material encapsulates at least a portion of the bottom electrode layer.

11. The micro-valve of claim 1, wherein the cantilevered portion includes a first portion extending from the base portion and a second portion extending from the first portion, wherein the second portion is differently-shaped than the first portion.

12. A micro-valve comprising:
    an orifice plate including an orifice;
    an actuating beam including a first end and a second end, wherein the actuating beam further comprises:
    a base layer;
    a layer of piezoelectric material disposed on the base layer and extending at least a portion of a distance between the first end and the second end, the layer of piezoelectric material defining a via therethrough to the base layer at an electrical connection portion thereof;
    a bottom electrode layer disposed on a first side of the layer of piezoelectric material at the electrical connection portion thereof;
    a top electrode layer disposed on a second side of the layer of piezoelectric material at the electrical connection portion thereof; and
    a bonding pad, at least a portion of the bonding pad disposed through the via on the base layer, the bonding pad comprising a bonding pad lead electrically connected to at least one of the bottom electrode layer or the top electrode layer, wherein the actuating beam includes a base portion extending from the electrical connection portion toward the first end and a cantilevered portion extending from the base portion toward the second end, wherein the cantilevered portion is movable in response to application of a differential electrical signal between the bottom electrode and the top electrode to one of open or close the micro-valve; and wherein the actuating beam comprises a passivation structure disposed on the layer of piezoelectric material, wherein the passivation structure conformally coats the beam with the exception of the bottom surface of the actuating beam.

13. A jetting assembly comprising:

a valve body comprising an orifice plate including a plurality of orifices extending therethrough;

a plurality of micro-valves, wherein each of the plurality of micro-valves comprises:

an actuating beam including a first end and a second end, wherein the actuating beam further comprises:

a base layer;

a layer of piezoelectric material disposed on the base layer and extending at least a portion of a distance between the first end and the second end, the layer of piezoelectric material defining a via therethrough at an electrical connection portion thereof;

a bottom electrode layer disposed on a first side of the layer of piezoelectric material at the electrical connection portion thereof, a portion of the bottom electrode layer disposed beneath the via; and a top electrode layer disposed on a second side of the layer of piezoelectric material at the electrical connection portion thereof, a portion of the top electrode layer disposed through the via, wherein the actuating beam includes a base portion extending from the electrical connection portion toward the first end and a cantilevered portion extending from the base portion toward the second end, wherein the cantilevered portion is movable in response to application of a differential electrical signal between the bottom electrode layer and the top electrode layer to one of open or close the micro-valve;

wherein the actuating beam comprises a passivation structure disposed on the layer of piezoelectric material, wherein the passivation structure conformally coats the beam with the exception of the bottom surface of the actuating beam; and a fluid manifold coupled to each of the plurality of micro-valves to define a fluid reservoir for each of the plurality of micro-valves.

14. The jetting assembly of claim 13, wherein each of the plurality of micro-valves further comprises a valve seat disposed on the orifice plate, the valve seat defining an opening in fluid communication with orifice and a fluid plenum.

15. The jetting assembly of claim 13, wherein the via is a first via, and wherein at the electrical connection portion of the actuating beam, the layer of piezoelectric material includes a second via defined therethrough to the base layer, wherein the micro-valve further comprises a bonding pad, at least a portion of the bonding pad disposed through the second via on the base layer and configured to receive a wire bond.

16. The jetting assembly of claim 13, wherein the fluid manifold is disposed between the plurality of micro-valves and a carrier, wherein the carrier substantially encloses a volume in which the fluid manifold and the plurality of micro-valves are disposed.

17. The jetting assembly of claim 16, further comprising an interposer disposed between the fluid manifold and the carrier.

18. The jetting assembly of claim 17, further comprising a flex circuit disposed between the fluid manifold and the interposer, and a circuit board attached to a side surface of the carrier, wherein the flex circuit electrically connects the actuating beams of the plurality of micro-valves to the circuit board via wire bonds connected to the actuating beams at the electrical connection portion.

19. The jetting assembly of claim 13, wherein each of the micro-valves further comprise a spacing member disposed on the orifice plate, wherein the electrical connection portion and the base portion are disposed on the spacing member.

* * * * *